US011658194B2

United States Patent
Lee et al.

(10) Patent No.: US 11,658,194 B2
(45) Date of Patent: May 23, 2023

(54) IMAGE SENSORS HAVING GRATING STRUCTURES THEREIN THAT PROVIDE ENHANCED DIFFRACTION OF INCIDENT LIGHT

(71) Applicant: Samsung Electronics Co., Ltd., Suwon-si (KR)

(72) Inventors: Wook Lee, Suwon-si (KR); Euiyoung Song, Seoul (KR); Kwanghee Lee, Seoul (KR); Uihui Kwon, Hwaseong-si (KR); Jae Ho Kim, Seoul (KR); Jungchak Ahn, Yongin-si (KR)

(73) Assignee: Samsung Electronics Co., Ltd.

( * ) Notice: Subject to any disclaimer, the term of this patent is extended or adjusted under 35 U.S.C. 154(b) by 142 days.

(21) Appl. No.: 16/286,897

(22) Filed: Feb. 27, 2019

(65) Prior Publication Data
US 2020/0075656 A1 Mar. 5, 2020

(30) Foreign Application Priority Data
Sep. 3, 2018 (KR) .................. 10-2018-0104648

(51) Int. Cl.
*H01L 27/146* (2006.01)
*G02B 5/18* (2006.01)
*H04N 5/378* (2011.01)

(52) U.S. Cl.
CPC ...... *H01L 27/14625* (2013.01); *G02B 5/1842* (2013.01); *G02B 5/1866* (2013.01);
(Continued)

(58) Field of Classification Search
CPC . H01L 27/14625; H01L 27/146–14893; H01L 27/14623; H01L 27/14643; G02B 5/18; G02B 5/1842; G02B 5/1847
See application file for complete search history.

(56) References Cited

U.S. PATENT DOCUMENTS 7,808,023 B2 10/2010 Yang et al.
8,384,172 B2 2/2013 Lee
(Continued)

FOREIGN PATENT DOCUMENTS

JP 2009-218357 9/2009
JP 2012-123869 6/2012
KR 10-2013-0068247 6/2013

OTHER PUBLICATIONS

Yokogawa et al. "IR sensitivity enhancement of CMOS Image Sensor with diffractive light trapping pixels" Nature, Scientific Reports 7(3832):1-7 (Jun. 19, 2017).

*Primary Examiner* — Matthew C Landau
*Assistant Examiner* — Mark Hatzilambrou
(74) *Attorney, Agent, or Firm* — Myers Bigel, P.A.

(57) ABSTRACT

An image sensor may include a semiconductor substrate having a light receiving surface thereon and a plurality of spaced-apart semiconductor photoelectric conversion regions at adjacent locations therein. A grating structure is provided on the light receiving surface. This grating structure extends opposite each of the plurality of spaced-apart photoelectric conversion regions. An optically-transparent layer is provided on the grating structure. This grating structure includes a plurality of spaced-apart grating patterns, which can have the same height and the same width. In addition, the grating patterns may be spaced apart from each other by a uniform distance. The grating structure is configured to selectively produce ±1 or higher order diffraction lights to the photoelectric conversion regions, in response to light incident thereon.

20 Claims, 17 Drawing Sheets

(52) U.S. Cl.
CPC .. *H01L 27/14623* (2013.01); *H01L 27/14643* (2013.01); *H04N 5/378* (2013.01)

(56) References Cited

U.S. PATENT DOCUMENTS

| | | |
|---|---|---|
| 8,823,067 B2 | 9/2014 | Iwasaki |
| 9,666,619 B2 | 5/2017 | Huang et al. |
| 9,819,846 B2 | 11/2017 | Masuda et al. |
| 2003/0183862 A1* | 10/2003 | Jin .......................... H01L 28/91 |
| | | 257/301 |
| 2006/0091300 A1 | 5/2006 | Nishimura |
| 2007/0045685 A1* | 3/2007 | Yang ................ H01L 27/14621 |
| | | 257/294 |
| 2012/0187514 A1* | 7/2012 | Mentzer .............. H01L 27/1464 |
| | | 257/432 |
| 2013/0334640 A1* | 12/2013 | Lee .................. H01L 31/02325 |
| | | 257/432 |
| 2014/0347538 A1* | 11/2014 | Toda ................ H01L 27/14605 |
| | | 257/292 |
| 2016/0079300 A1* | 3/2016 | Watanabe ............... H01L 31/18 |
| | | 257/432 |
| 2016/0112614 A1* | 4/2016 | Masuda ................ H04N 5/374 |
| | | 348/374 |
| 2017/0110493 A1* | 4/2017 | Yokogawa ............ H01L 27/146 |
| 2017/0243909 A1* | 8/2017 | Kurokawa ............ H01L 27/307 |
| 2017/0261738 A1 | 9/2017 | Shiono |

\* cited by examiner

IMAGE SENSORS HAVING GRATING STRUCTURES THEREIN THAT PROVIDE ENHANCED DIFFRACTION OF INCIDENT LIGHT

REFERENCE TO PRIORITY APPLICATION

This U.S. non-provisional patent application claims priority under 35 U.S.C. § 119 to Korean Patent Application No. 10-2018-0104648, filed Sep. 3, 2018, the disclosure of which is hereby incorporated herein by reference.

BACKGROUND

The present disclosure relates to image sensors and, in particular, to image sensors that sense incident light, including relatively long wavelength light, with improved sensitivity.

An image sensor is an electronic device that converts optical images into electrical signals within the device. With the recent development of the computer and communication industries, there is an increased demand for high-performance image sensors in a variety of applications such as digital cameras, camcorders, personal communication systems, gaming machines, security cameras, micro-cameras for medical applications, and/or robots. In addition, image sensors for realizing three-dimensional and/or color images are recently being developed.

SUMMARY

Some embodiments of the invention provide an image sensor having an improved sensitivity to incident light, including relatively long wavelength light. For example, in some of these embodiments, an image sensor is provided, which includes a semiconductor substrate having a light receiving surface thereon and a plurality of spaced-apart photoelectric conversion regions at adjacent locations therein. A grating structure is also provided adjacent the light receiving surface, which extends opposite each of the plurality of spaced-apart photoelectric conversion regions. This grating structure may include a plurality of spaced-apart grating patterns, which have the same height and the same width. An optically-transparent layer is provided on the grating structure.

According to additional embodiments of the invention, the plurality of spaced-apart grating patterns are spaced apart from each other by a uniform distance. And, in some cases, a pitch between adjacent grating patterns may be equivalent to two times the width of the grating patterns. Advantageously, in additional embodiments of the invention, the grating structure is configured to produce, in response to light incident thereon, ±1 or higher order diffraction lights to the photoelectric conversion regions, while relatively suppressing zero order diffraction light. In further embodiments, the grating structure includes a semiconductor material. The grating structure may also include a broader class of materials having a lower refractive index relative to the semiconductor substrate.

According to further embodiments of the invention, each of the plurality of spaced-apart photoelectric conversion regions is separated from an adjacent photoelectric conversion region by a corresponding pixel separation structure. In some embodiments, these pixel separation structures may extend entirely through the semiconductor substrate.

According to additional embodiments of the invention, an image sensor may include a semiconductor substrate having a first surface and a second surface, which face each other, and including a plurality of pixel regions, photoelectric conversion regions respectively provided on the pixel regions of the semiconductor substrate, grating patterns provided on the first surface of the semiconductor substrate and spaced apart from each other by a uniform distance, and an optically-transparent layer provided to cover the grating patterns. The grating patterns may have substantially the same width and substantially the same height to achieve desired light diffraction characteristics.

Additional embodiments of image sensors may include a semiconductor substrate of a first conductivity type, a photoelectric conversion region, which is provided in the semiconductor substrate and is doped to have a second conductivity type, and a grating structure provided on the semiconductor substrate. The grating structure may include grating patterns, which are configured to provide a diffraction light produced through diffraction of an incident light to the photoelectric conversion region and to preferentially suppress a zero order diffraction light.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
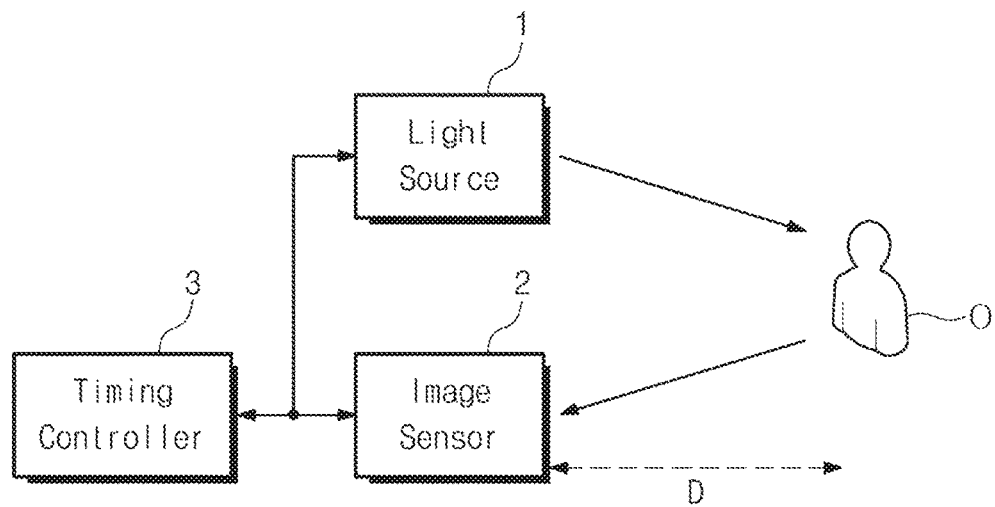
FIG. 1 is a schematic diagram illustrating an image sensor system according to some embodiments of the inventive concept.

FIG. 1 is a schematic diagram illustrating an image sensor system according to some embodiments of the inventive concept. Referring to FIG. 1, an image sensor system according to some embodiments of the inventive concept may be configured to irradiate light to an object O, to sense light reflected from the object O, and to calculate an optical depth or distance to the object O. The image sensor system may include a light source 1 sending light to the object O, an image sensor 2 sensing light reflected from the object O and a timing controller 3 configured to provide a synchronization signal to the light source 1 and the image sensor 2.

The light source 1 may emit a pulsed optical signal to the object O. In some embodiments, the light source 1 may be configured to emit infrared, microwave, or visible light. A light emitting diode (LED), a laser diode (LD) or an organic light emitting diode (OLED) may be used for the light source 1.

The image sensor 2 may be formed to sense light reflected from the object O and to output information on an optical depth to the object O. Similar to an infrared camera, the optical depth information may be used to realize a three-dimensional image. Furthermore, the image sensor 2 may include depth pixels and visible light pixels, and in this case, it may be possible to realize three-dimensional color images.

The timing controller 3 may control operations of the light source 1 and the image sensor 2. For example, the timing controller 3 may be configured to synchronize a light emitting operation of the light source 1 with a light-receiving operation of the image sensor 2.

Figure 2:
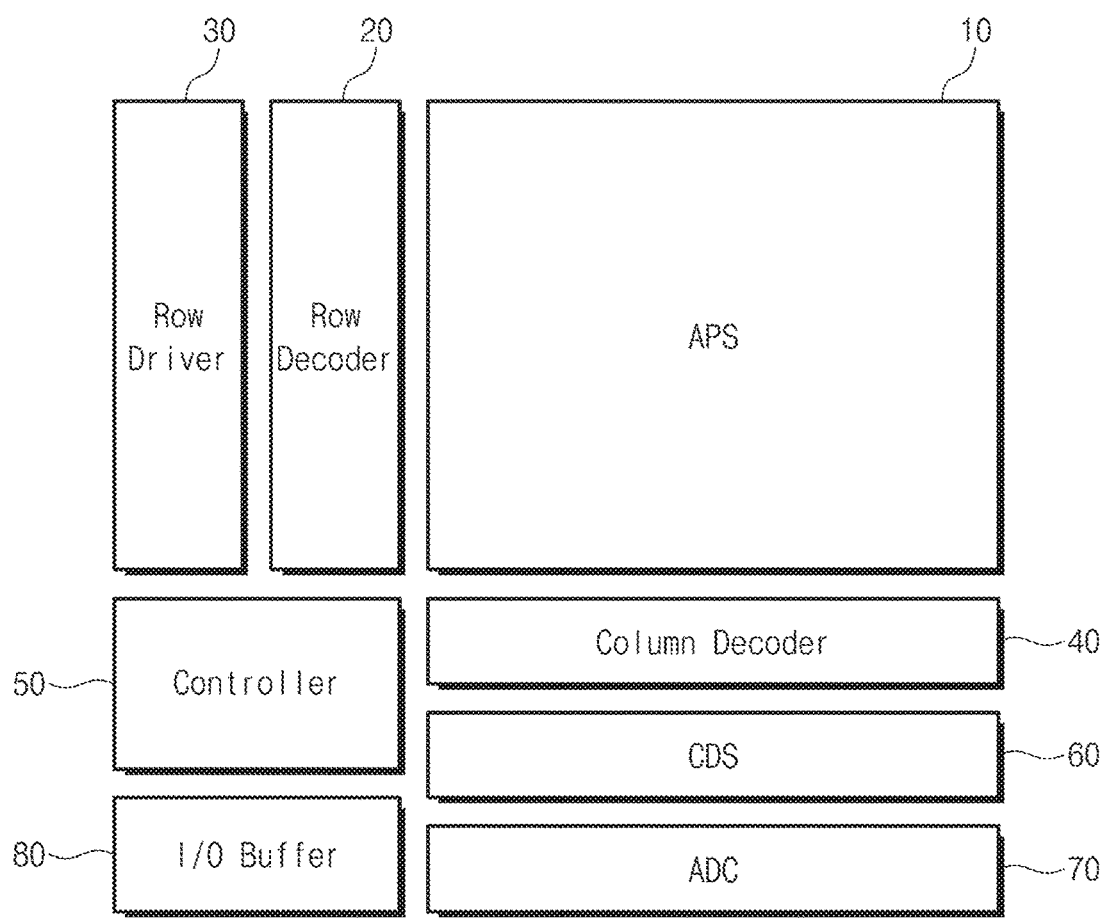
FIG. 2 is a block diagram illustrating an image sensor according to some embodiments of the inventive concept.

FIG. 2 is a block diagram illustrating an image sensor according to some embodiments of the inventive concept. Referring to FIG. 2, an image sensor may include an active pixel sensor array 10, a row decoder 20, a row driver 30, a column decoder 40, a controller 50, a correlated double sampler (CDS) 60, an analog to digital converter (ADC) 70, and an input/output (I/O) buffer 80.

The active pixel sensor array 10 may include a plurality of unit pixels, which are two-dimensionally arranged, and may be used to convert optical signals to electrical signals. The active pixel sensor array 10 may be driven by a plurality of driving signals (e.g., pixel-selection, reset, and charge-transfer signals), which are transmitted from the row driver 30. The converted electrical signals may be provided to the correlated double sampler 60.

The row driver 30 may be configured to generate driving signals for driving the unit pixels, based on information decoded by the row decoder 20, and then to transmit the driving signals to the active pixel sensor array 10. When the unit pixels are arranged in a matrix form (i.e., in rows and columns), the driving signals may be provided to respective rows. The controller 50 may provide timing signals and control signals to the row decoder 20 and the column decoder 40.

The correlated double sampler 60 may be configured to receive the electric signals generated in the active pixel sensor array 10 and then to perform an operation of holding and sampling the received electric signals. For example, the correlated double sampler 60 may perform a double sampling operation on a specific noise level and a signal level of the electric signal and then output a difference level corresponding to a difference between the noise and signal levels.

The analog-to-digital converter 70 may be configured to convert an analog signal, which contains information on the difference level outputted from the correlated double sampler 60, to a digital signal and then to output the digital signal.

The I/O buffer 80 may be configured to latch the digital signals and then to output the latched digital signals sequentially to an image signal processing unit (not shown), based on information decoded by the column decoder 40.

Figure 3:
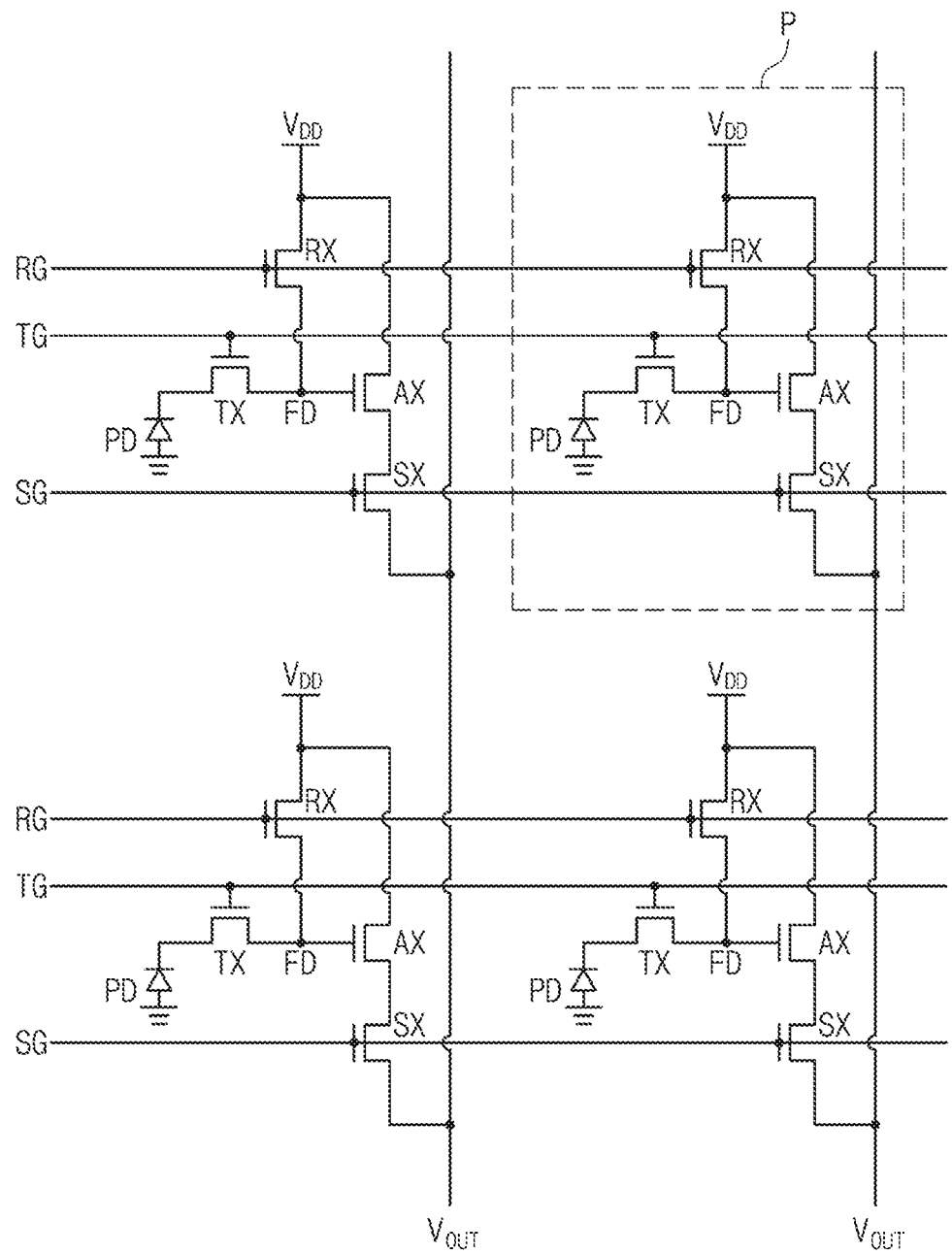
FIG. 3 is a circuit diagram illustrating an active pixel sensor array of an image sensor according to some embodiments of the inventive concept.

FIG. 3 is a circuit diagram illustrating an active pixel sensor array of an image sensor according to some embodiments of the inventive concept. Referring to FIG. 3, the active pixel sensor array 10 may include a plurality of unit pixels P, which are two-dimensionally arranged in rows and columns. In each of the unit pixels P, an electrical signal may be produced by an incident light, and an operation of each of the unit pixels P may be controlled by driving signals that are transmitted through a charge transfer line TG, a reset line RG, and a pixel selection line SG connected to the unit pixels P.

Each of the unit pixels P may include a transfer transistor TX and logic transistors RX, SX, and DX. Here, the logic transistors may include a reset transistor RX, a selection transistor SX, and a source follower transistor or amplifying transistor AX.

The transfer transistor TX may include a transfer gate electrode TG, a photoelectric conversion device PD, and a charge detection node or floating diffusion region FD. The photoelectric conversion device PD may be configured to generate photocharges in proportional to an amount of externally incident light and to store the photocharges. In some embodiments, the photoelectric conversion device PD may be provided in a form of a photo diode, a photo transistor, a photo gate, a pinned photo diode (PPD), or any combination thereof.

The transfer transistor TX may transfer electric charges, which are cumulatively stored in the photoelectric conversion device PD, to the charge storing node FD. The transfer transistor TX may be controlled by a charge transfer signal provided through the charge transfer line TG. The charge storing node FD may be configured to cumulatively store photocharges, which are produced in the photoelectric conversion device PD, and an electric potential of a gate electrode of the source follower transistor AX may be changed depending on an amount of photocharges stored in the charge storing node FD.

The reset transistor RX may be configured to periodically discharge the photocharges stored in the charge storing node FD. For example, a gate electrode of the reset transistor RX may be connected to the reset signal line RG, to which a reset signal is provided. A drain electrode of the reset transistor RX may be connected to the charge storing node FD, and a source electrode of the reset transistor RX may be connected to a power voltage $V_{DD}$. If the reset transistor RX is turned on by the reset signal, the power voltage $V_{DD}$ connected to the source electrode of the reset transistor RX may be transferred to the charge storing node FD. In other words, if the reset transistor RX is turned on, the photocharges stored in the charge storing node FD may be discharged and the charge storing node FD may be reset.

The source follower transistor AX may be configured to amplify a change in electric potential of the charge storing node FD and to output the amplified or pixel signal to an output line $V_{OUT}$ through the selection transistor SX. The source follower transistor AX may be a source follower buffer amplifier, which is configured to generate a source-drain current in proportion to an amount of photocharges input through its gate electrode. A gate electrode of the source follower transistor AX may be connected to the charge storing node FD, a drain electrode of the source follower transistor AX may be connected to the power voltage VDD, and a source electrode of the source follower transistor AX may be connected to a drain electrode of the selection transistor SX.

The selection transistor SX may be used to select each row of the unit pixels PX for a read operation. A selection gate electrode of the selection transistor SX may be connected to the selection line SG, to which a selection signal is provided. If the selection transistor SX is turned on by the selection signal, a pixel signal, which is output through the source electrode of the source follower transistor AX, may be output to the output line $V_{OUT}$.

Although FIG. 3 illustrates an example, in which each of the unit pixels P is configured to have four transistors, the unit pixel may be configured to have a three or five transistor structure or a photogate structure similar to the four transistor structure.

Figure 4:
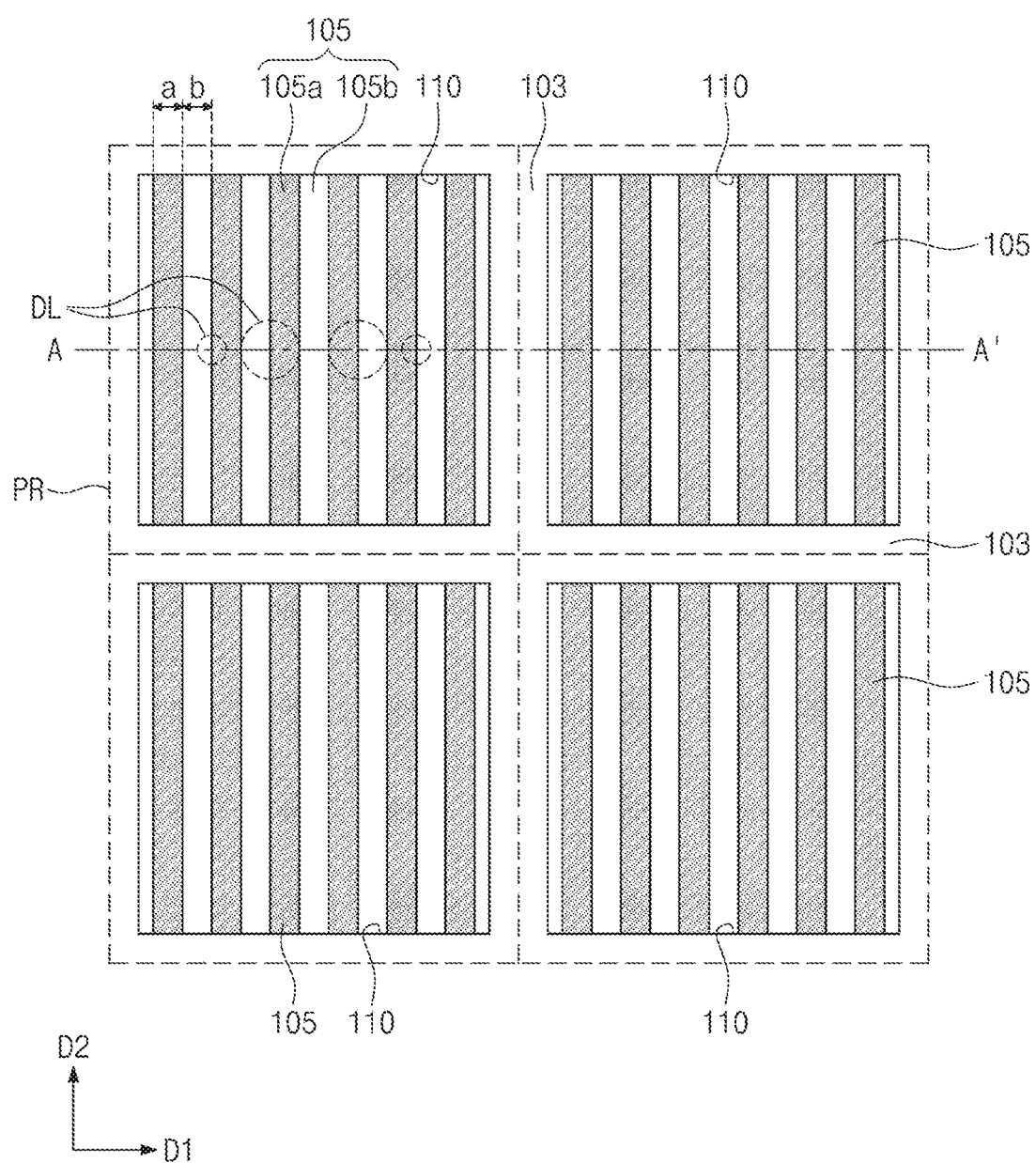
FIG. 4 is a schematic plan view illustrating an image sensor according to some embodiments of the inventive concept.
Figure 5:
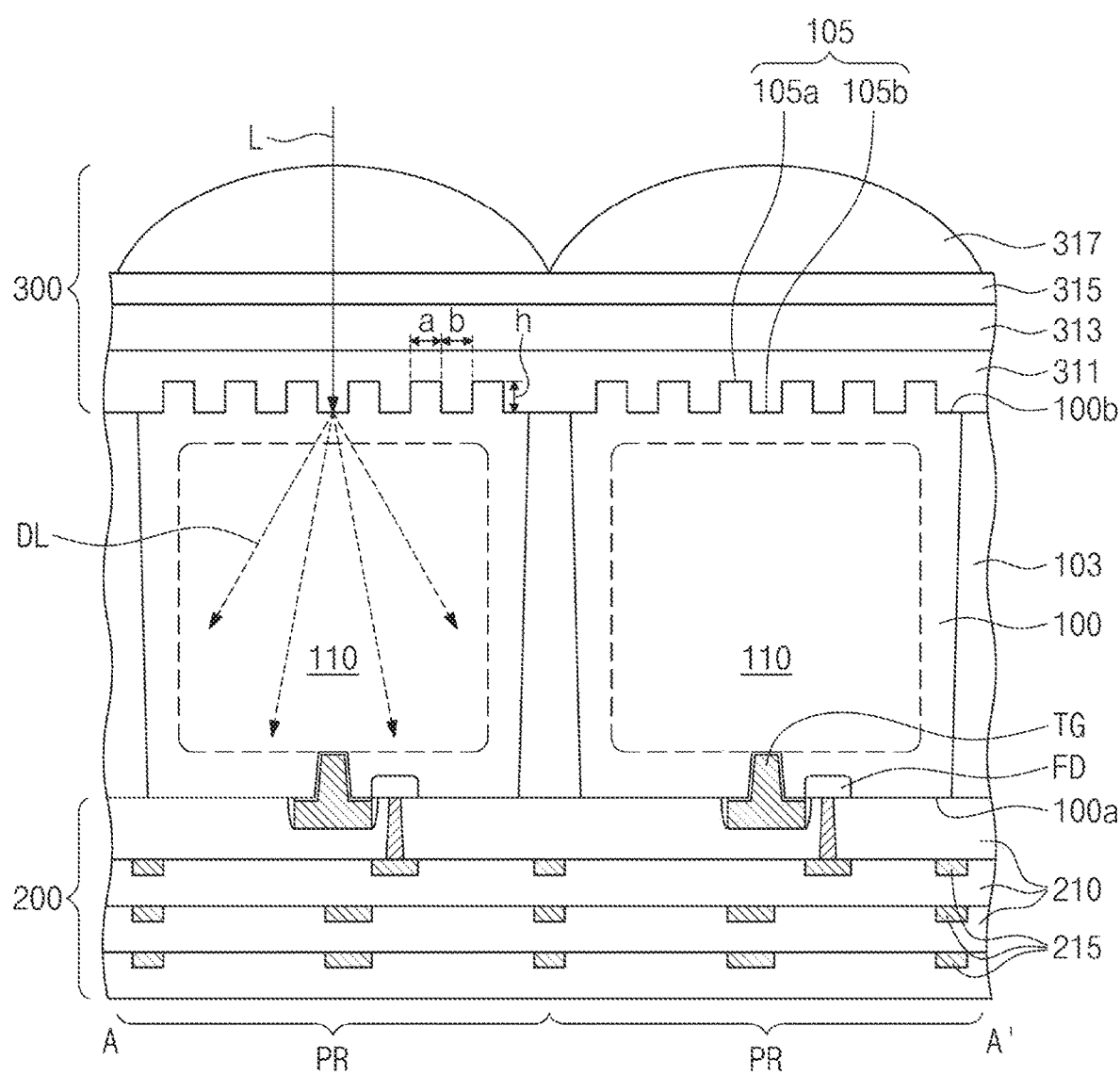
FIGS. 5 and 6 are sectional views, each of which is taken along line A-A' of FIG. 4 and illustrate an image sensor according to some embodiments of the inventive concept.
Figure 6:
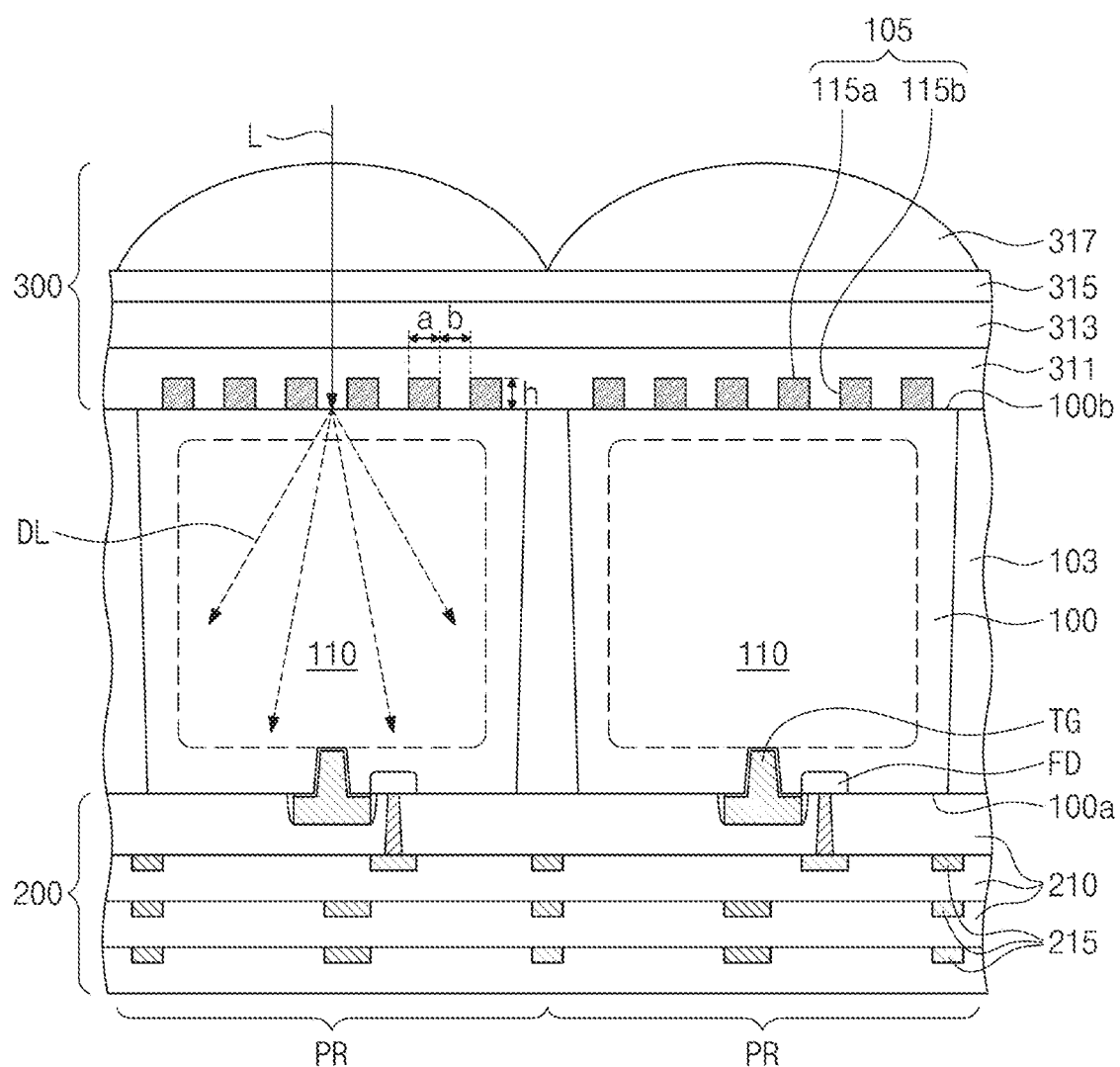
Figure 7:
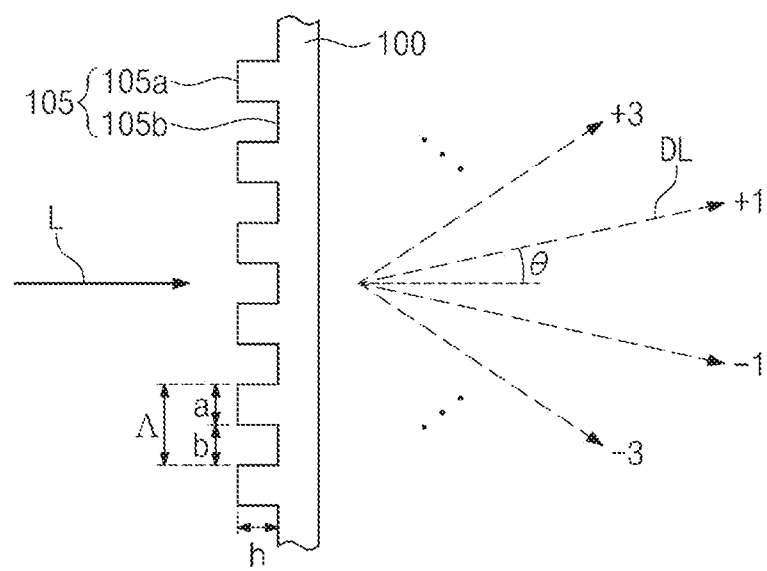
FIG. 7 is a diagram illustrating a grating structure provided in an image sensor according to some embodiments of the inventive concept.

FIG. 4 is a schematic plan view illustrating an image sensor according to some embodiments of the inventive concept. FIGS. 5 and 6 are sectional views, each of which is taken along line A-A' of FIG. 4 to illustrate an image sensor according to some embodiments of the inventive concept. FIG. 7 is a diagram illustrating a grating structure provided in an image sensor according to some embodiments of the inventive concept.

Referring to FIGS. 4 and 5, an image sensor according to some embodiments of the inventive concept may include a photoelectric conversion layer, a read-out circuit layer 200, and an optically-transparent layer 300. When viewed in a vertical section, the photoelectric conversion layer may be provided between the read-out circuit layer 200 and the optically-transparent layer 300.

The photoelectric conversion layer may include a semiconductor substrate 100, a pixel separation structure 103 defining pixel regions PR, and photoelectric conversion regions 110 provided in the pixel regions PR.

In detail, the semiconductor substrate 100 may have two opposite surfaces (e.g., a first or front surface 100a and a second or rear surface 100b). In some embodiments, a substrate, in which an epitaxial layer of a first conductivity type (e.g., p-type) is formed on a bulk silicon substrate of the first conductivity type, may be provided for the semiconductor substrate 100, and during a process of fabricating an image sensor, the bulk silicon substrate may be removed. For example, a substrate with only the p-type epitaxial layer may be used as the semiconductor substrate 100. In certain embodiments, the semiconductor substrate 100 may be a bulk semiconductor substrate, in which a well region of the first conductivity type is provided.

The semiconductor substrate 100 may include a plurality of the pixel regions PR defined by the pixel separation structure 103. The pixel regions PR may be arranged in two different directions (e.g., a first direction D1 and a second direction D2) or in a matrix shape.

The pixel separation structure 103 may be provided to enclose each of the pixel regions PR, when viewed in a plan view. For example, the pixel separation structure 103 may include first portions, which are extended parallel to each other in the first direction D1, and second portions, which are extended parallel to each other in the second direction D2 to cross the first portions.

The pixel separation structure 103 may be formed of or include an insulating material whose refractive index is lower than that of the semiconductor substrate 100 (e.g., silicon) and may include one or more insulating layers. For example, the pixel separation structure 103 may be formed of or include silicon oxide, silicon nitride, un-doped polysilicon, air, or any combination thereof. In some embodiments, the formation of the pixel separation structure 103 may include patterning the first surface 100a and/or the second surface 100b to form a deep trench in the semiconductor substrate 100 and then filling the deep trench with an insulating material.

The pixel separation structure 103 may be provided to penetrate the semiconductor substrate 100. For example, a vertical thickness of the pixel separation structure 103 may be substantially equal to a vertical thickness of the semiconductor substrate 100. In certain embodiments, the vertical thickness of the pixel separation structure 103 may be less than the vertical thickness of the semiconductor substrate 100. In other words, the second surface 100b of the semiconductor substrate 100 may be spaced apart from the pixel separation structure 103. In certain embodiments, the pixel separation structure 103 may be an impurity region that is formed by doping the semiconductor substrate 100 of the first conductivity type with impurities of the second conductivity type.

The photoelectric conversion regions 110 may be provided in the pixel regions PR of the semiconductor substrate 100, respectively. The photoelectric conversion regions 110 may be two-dimensionally arranged in the first and second directions D1 and D2. In some embodiments, the photoelectric conversion regions 110 may be formed by injecting impurities into the semiconductor substrate 100 and may be formed to have a second conductivity type different from the first conductivity type of the semiconductor substrate 100. In this case, the semiconductor substrate 100 of the first conductivity type and the photoelectric conversion regions 110 of the second conductivity type may form PN junctions serving as photodiodes. An externally incident light may be converted to electrical signals in the photoelectric conversion regions 110.

The read-out circuit layer 200 may be disposed on the first surface 100a of the semiconductor substrate 100. The read-out circuit layer 200 may include read-out circuits (e.g., MOS transistors), which are electrically connected to the photoelectric conversion regions 110.

For example, in each of the pixel regions PR, the transfer gate electrodes TG may be provided on the first surface 100a of the semiconductor substrate 100, and moreover, the read-out circuits described with reference to FIG. 3 may be further provided on the first surface 100a of the semiconductor substrate 100. Here, the read-out circuit layer 200 may include the reset transistor RX, the selection transistor SX, and the source follower transistor AX previously described with reference to FIG. 3.

As an example, the transfer gate electrode TG may be located at a center region of each pixel region PR, when viewed in a plan view. A portion of the transfer gate electrode TG may be placed in the semiconductor substrate 100, and a gate insulating layer may be interposed between the transfer gate electrode TG and the semiconductor substrate 100. The floating diffusion region FD may be provided in a portion of the semiconductor substrate 100 located at one side of the transfer gate electrode TG. The floating diffusion region FD may be formed by injecting impurities into the semiconductor substrate 100 and may have a conductivity type different from that of the semiconductor substrate 100. For example, the floating diffusion region FD may be an n-type impurity region.

Interlayered insulating layers 210 may be stacked on the first surface 100a of the semiconductor substrate 100 to cover MOS transistors of the read-out circuits and the transfer gate electrode TG. The interlayered insulating layers 210 may be formed of or include at least one of, for example, silicon oxide, silicon nitride, or silicon oxynitride. Connection lines 215 may be provided on each of the interlayered insulating layers 210 and may be electrically connected to the read-out circuits through contact plugs.

In some embodiments, in each of the pixel regions PR, a grating structure 105 may be provided on the second surface 100b of the semiconductor substrate 100. The grating structure 105 may include a plurality of grating patterns 105a and a plurality of recess regions 105b, which are alternately arranged. The grating patterns 105a may be provided to have a uniform width (e.g., a first width a) and may be spaced apart from each other by a uniform distance (e.g., a first distance b). In other words, the width of each of the recess regions 105b may correspond to the first distance b. The recess regions 105b may have bottom surfaces that are substantially parallel to the second surface 100b of the semiconductor substrate 100. In other words, the grating patterns 105a may have a uniform height h. A structure of the grating structure 105 will be described in more detail with reference to FIG. 7.

In some embodiments, an incident light L of a long wavelength may be diffracted in the semiconductor substrate 100 by the grating structure 105 to form diffraction lights DL, which have orders of ±1 or higher and incident in oblique directions. Due to a change in refractive index, there may be a phase difference of 180° between lights passing through the grating pattern 105a and the recess region 105b, and thus, a zero order diffraction light may be minimized and only ±1 or higher order diffraction lights may be produced. Furthermore, as shown in FIG. 4, the diffraction lights DL may be produced in a direction (i.e., the first direction D1), which is perpendicular to an extension direction (i.e., the second direction D2) of the grating patterns 105a.

As an example, the grating patterns 105a may be line-shaped patterns, which are parallel to each other and extends in the second direction D2. In other words, the grating patterns 105a may be provided to cross each photoelectric conversion region 110, when viewed in a plan view.

As shown in FIG. 5, the grating structure 105 may be formed by forming an etch mask pattern on the second surface 100b of the semiconductor substrate 100 and anisotropically etching the second surface 100b of the semiconductor substrate 100 using the etch mask pattern. In other words, the grating patterns 105a of the grating structure 105 may be portions of the semiconductor substrate 100, which means the grating patterns and the semiconductor substrate may be formed of the same semiconductor material.

As shown in FIG. 6, the grating structure 105 may include a plurality of dielectric patterns 115a, which are spaced apart from each other on the second surface 100b of the semiconductor substrate 100. For example, the grating structure 105 may include the dielectric patterns 115a and recess regions 115b, which are defined by side surfaces of the dielectric patterns 115a and the second surface 100b of the semiconductor substrate 100. As an example, the formation of the dielectric patterns 115a may include depositing a dielectric layer on the second surface 100b of the semiconductor substrate 100 and patterning the dielectric layer. Here, the dielectric patterns 115a may be formed of or include a dielectric material whose refractive index is different from that of the semiconductor substrate 100. As an example, the dielectric patterns 115a may be formed of an insulating material (e.g., silicon oxide) having a refractive index lower than that of the semiconductor substrate 100 (e.g., silicon).

The optically-transparent layer 300 may be disposed on the second surface 100b of the semiconductor substrate 100 provided with the grating structure 105. The optically-transparent layer 300 may include a first planarization insulating layer 311, an optical filter layer 313, a second planarization insulating layer 315, and micro lenses 317.

The first planarization insulating layer 311 may cover the second surface 100b of the semiconductor substrate 100 provided with the grating structure 105. In other words, the first planarization insulating layer 311 may be provided to fill the recess regions 105b and 115b of the grating structure 105. The first planarization insulating layer 311 may be formed of or include an insulating material whose refractive index is different from that of the semiconductor substrate 100. For example, the first planarization insulating layer 311 may be formed of an insulating material whose refractive index is lower than that of silicon. For example, the first planarization insulating layer 311 may have a refractive index of about 1.4 to about 4.0.

The optical filter layer 313 may be configured to pass a portion of an externally incident light (e.g., of a specific wavelength range). For example, the optical filter layer 313 may be configured to allow an infrared light of an externally incident light to propagate toward the photoelectric conversion regions 110. In this case, the photoelectric conversion regions 110 may be configured to sense the infrared light and to produce an electrical signal.

The second planarization insulating layer 315 may be formed of or include at least one of, for example, $Al_2O_3$, $CeF_3$, HfO2, ITO, MgO, $Ta_2O_5$, $TiO_2$, $ZrO_2$, Si, Ge, ZnSe, ZnS, or $PbF_2$. Alternatively, the second planarization insulating layer 315 may be formed of or include at least one of organic materials having high refractive indices (e.g., siloxane resin, benzocyclobutene (BCB), polyimide, acryl, parylene C, poly(methyl methacrylate) (PMMA), polyethylene terephthalate (PET), or the like). In certain embodiments, the second planarization insulating layer 315 may be formed of or include at least one of, for example, strontium titanate (SrTiO3), polycarbonate, glass, bromine, sapphire, cubic zirconia, potassium Niobate (KNbO3), moissanite (SiC), gallium(III) phosphide (GaP), gallium(III) arsenide (GaAs), or the like.

The micro lenses 317 may be provided on the second planarization insulating layer 315 to face the photoelectric conversion regions 110, respectively. The micro lenses 317 may be two-dimensionally arranged in two different directions (e.g., the first and second directions D1 and D2). The micro lenses 317 may have an upward convex shape with a specific curvature radius. The micro lenses 317 may be configured to change a propagation path of light incident into the image sensor and to condense the incident light. The micro lenses 317 may be formed of or include an optically transparent resin.

In some embodiments, a long wavelength light of about 750 nm or longer may be incident into the photoelectric conversion regions 110, and in this case, the long wavelength light may have a penetration depth larger than a thickness of the semiconductor substrate 100. In some embodiments, the incident light L of long wavelength may be diffracted by the grating structure 105 to form diffraction lights DL incident into the photoelectric conversion regions 110.

Referring to FIG. 7, the grating structure 105 according to some embodiments of the inventive concept may be configured to have a period A corresponding to a sum of the width a of the grating pattern 105*a* and the distance b of the grating patterns 105*a* (i.e., Λ=a+b). The grating structure 105 may have a fill factor (FF) that is defined as a ratio of the width a of the grating pattern 105*a* to the period A of the grating structure 105. In other words, the fill factor (FF) of the grating structure 105 may be given by the following formula 1.

$$FF=a/(a+b) \quad \text{[Formula 1]}$$

In some embodiments, the grating structure 105 may be designed to have a fill factor of 50%. In other words, the width a of the grating patterns 105*a* may be substantially equal to the distance b of the grating patterns 105*a*. As an example, a period L of the grating structure 105 may range from about 0.6 μm to 0.9 μm.

The diffraction light DL passing through the grating structure 105 may have a phase difference (Δφ) given by the following formula 2.

$$\Delta\Phi=(n1-n2)h2\pi/\lambda \quad \text{[Formula 2]}$$

where λ is a wavelength of an incident light, n1−n2 is a difference between refractive indices, and h is a height of the grating pattern. Furthermore, n1 is a refractive index of the grating patterns, and n2 is a refractive index of a material (e.g., the first planarization insulating layer 311) provided between the grating patterns.

In some embodiments, the height h of the grating structure 105 may be determined to realize a phase difference (Δφ) of 180°. As an example, the height h of the grating structure 105 may range from about 0.2 μm to about 0.4 μm.

In some embodiments, an angle θ of the diffraction light DL may be given by the following formula 3.

$$\sin\theta=m\lambda/n\Lambda \quad \text{[Formula 3]}$$

where λ is a wavelength of an incident light, m is an order of the grating, n is a refractive index of the grating pattern, and Λ is a period of the grating structure.

In some embodiments, the grating structure 105 may be formed to have a fill-factor of 50% and a phase difference of 180°, and in this case, the grating structure 105 may produce ±1 or higher order diffraction lights DL, without a zero order diffraction light. In some embodiments, the grating structure 105 may be configured to suppress the zero and even-order diffraction lights and to provide odd-order diffraction lights DL to the photoelectric conversion region 110. In other words, as shown in FIGS. 5 and 6, the diffraction lights DL may be provided to the semiconductor substrate 100 at an angle inclined to a surface of the semiconductor substrate 100. Thus, a length of a propagation path of the incident light propagating toward the photoelectric conversion region 110 may be increased, and this may make it possible to improve an optical absorption efficiency (e.g., quantum efficiency) in the photoelectric conversion region 110.

As an example, in the case where the incident light L of about 940 nm wavelength is incident into the grating structure 105, the period Λ of the grating structure 105 may be about 0.6 μm, the width a of the grating pattern 105*a* may be about 0.3 μm, and the height h of the grating pattern 105*a* may be about 0.25 μm.

For concise description, an element similar to that in the previously described embodiment may be identified by the same reference number without repeating an overlapping description thereof.

Figure 8:
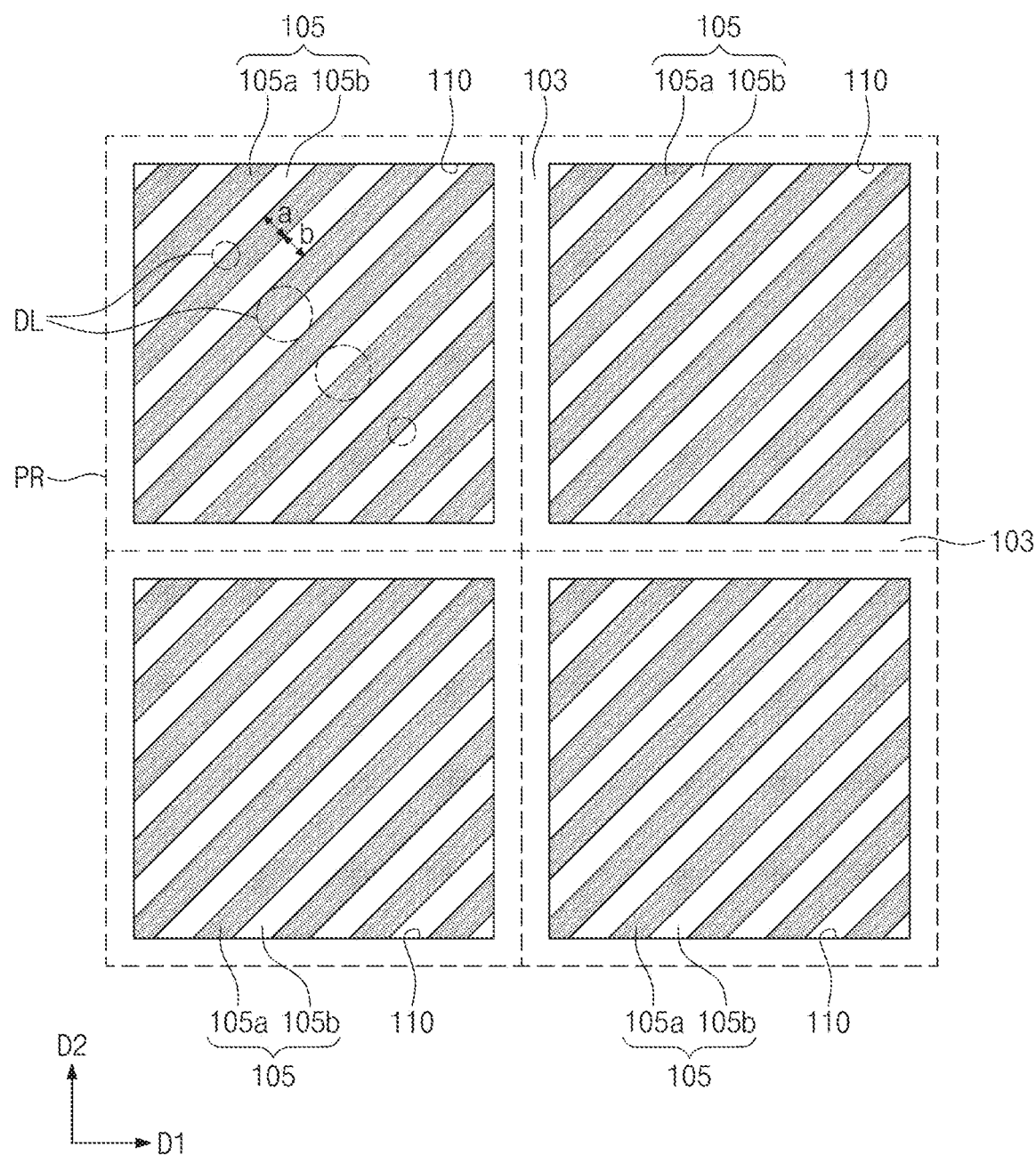
FIG. 8 is a schematic plan view of an image sensor according to some embodiments of the inventive concept.

FIG. 8 is a schematic plan view of an image sensor according to some embodiments of the inventive concept. Referring to FIGS. 5 and 8, the grating structure 105 may be provided on the second surface 100*b* of the semiconductor substrate 100, and the grating structure 105 may include a plurality of the grating patterns 105*a*, each of which has a first width a, and a plurality of the recess regions 105*b* between the grating patterns 105*a*. Here, the grating patterns 105*a* and the recess regions 105*b* may be extended in an oblique direction that is inclined at an angle to both of the first and second directions D1 and D2, when viewed in a plan view. According to an embodiment shown in FIG. 8, the grating structure 105 may produce the diffraction lights DL in a direction perpendicular to the extension direction of the grating patterns 105*a*.

Figure 9:
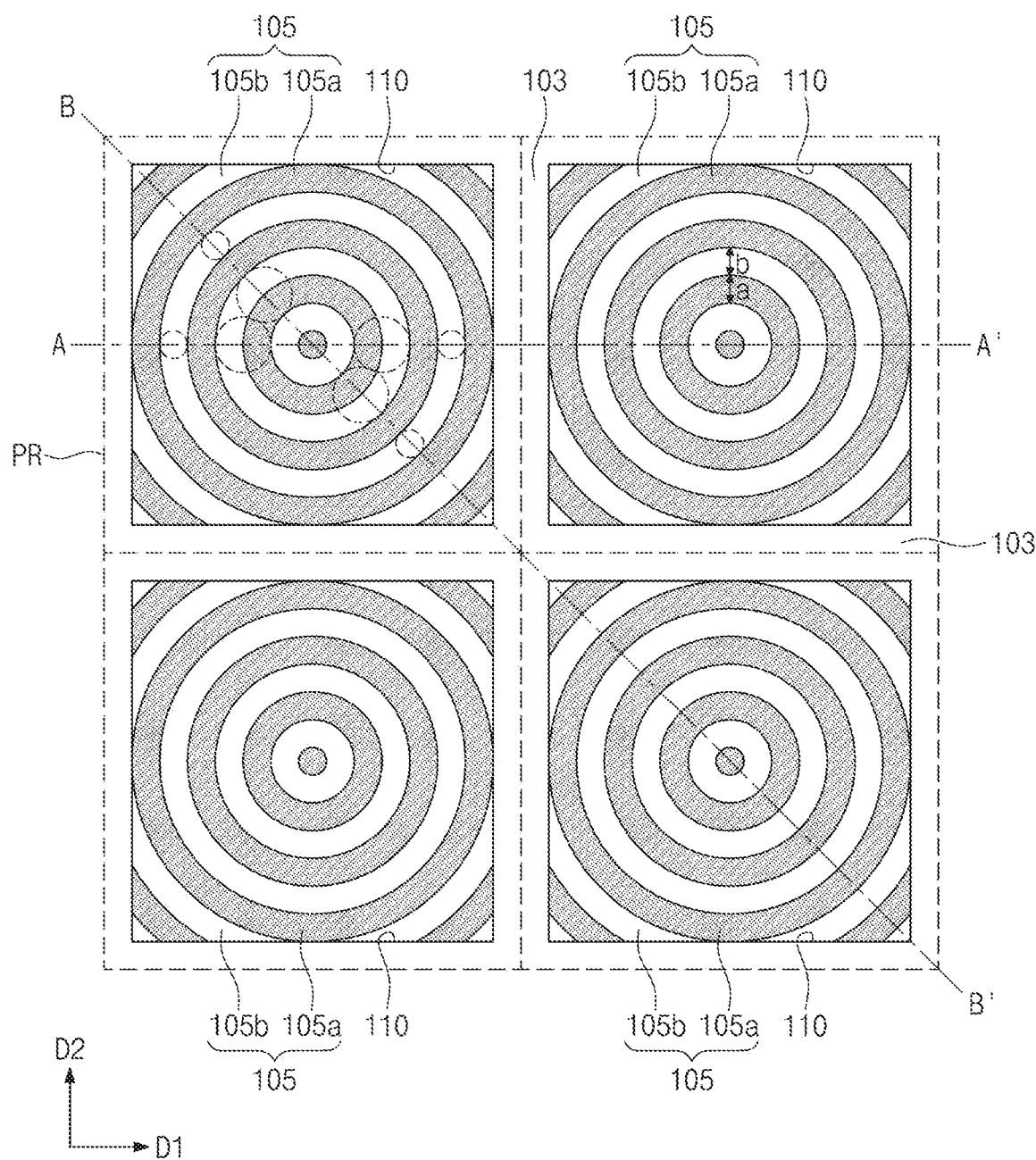
FIG. 9 is a schematic plan view of an image sensor according to some embodiments of the inventive concept.
Figure 10:
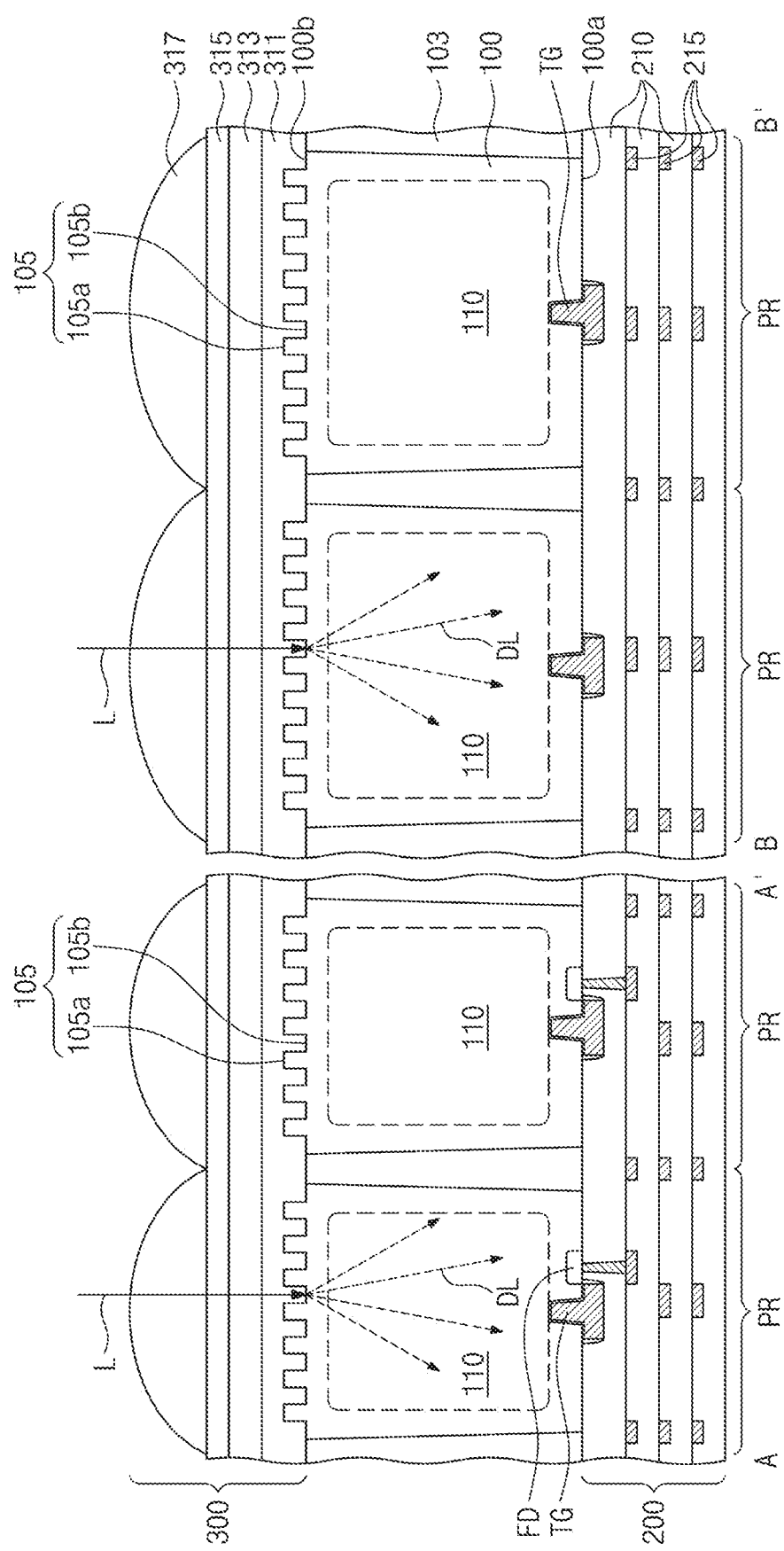
FIG. 10 illustrates a pair of cross-sectional views, which are taken along lines A-A' and B-B' of FIG. 9 and which illustrate an image sensor according to some embodiments of the inventive concept.

FIG. 9 is a schematic plan view of an image sensor according to some embodiments of the inventive concept. FIG. 10 is sectional views, which are taken along lines A-A' and B-B' of FIG. 9 to illustrate an image sensor according to some embodiments of the inventive concept. Referring to FIGS. 9 and 10, the grating structure 105 may be provided in each of the pixel regions PR, and the grating structure 105 may include the grating patterns 105*a* and the recess regions 105*b*. Here, the grating patterns 105*a* may include a plurality of circular patterns, which are concentrically provided. Each of the circular patterns may have a first width a and may be spaced apart from each other by the same distance b.

According to an embodiment shown in FIGS. 9 and 10, the period, the fill factor, and the height of the grating structure 105 may be the same in all directions. Since the diffraction lights DL produced by in the grating structure 105 are produced in a direction perpendicular to an extension direction of the grating pattern 105*a*, the diffraction lights DL may be produced in all directions. Thus, the quantum efficiency of the photoelectric conversion region 110 may be uniform in all directions.

Figure 11A:
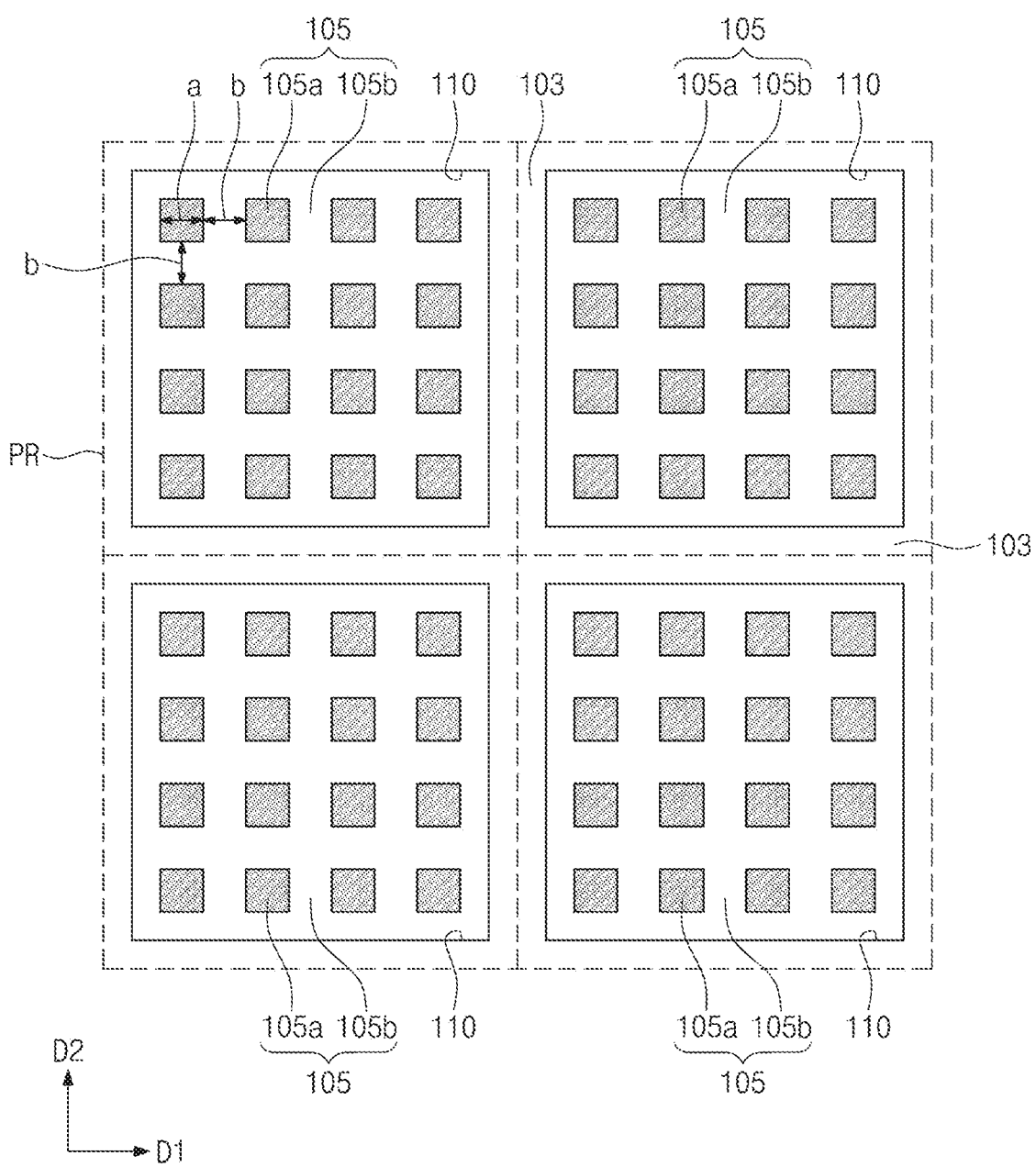
FIGS. 11A, 11B, and 11C are schematic plan views illustrating image sensors according to some embodiments of the inventive concept.
Figure 11B:
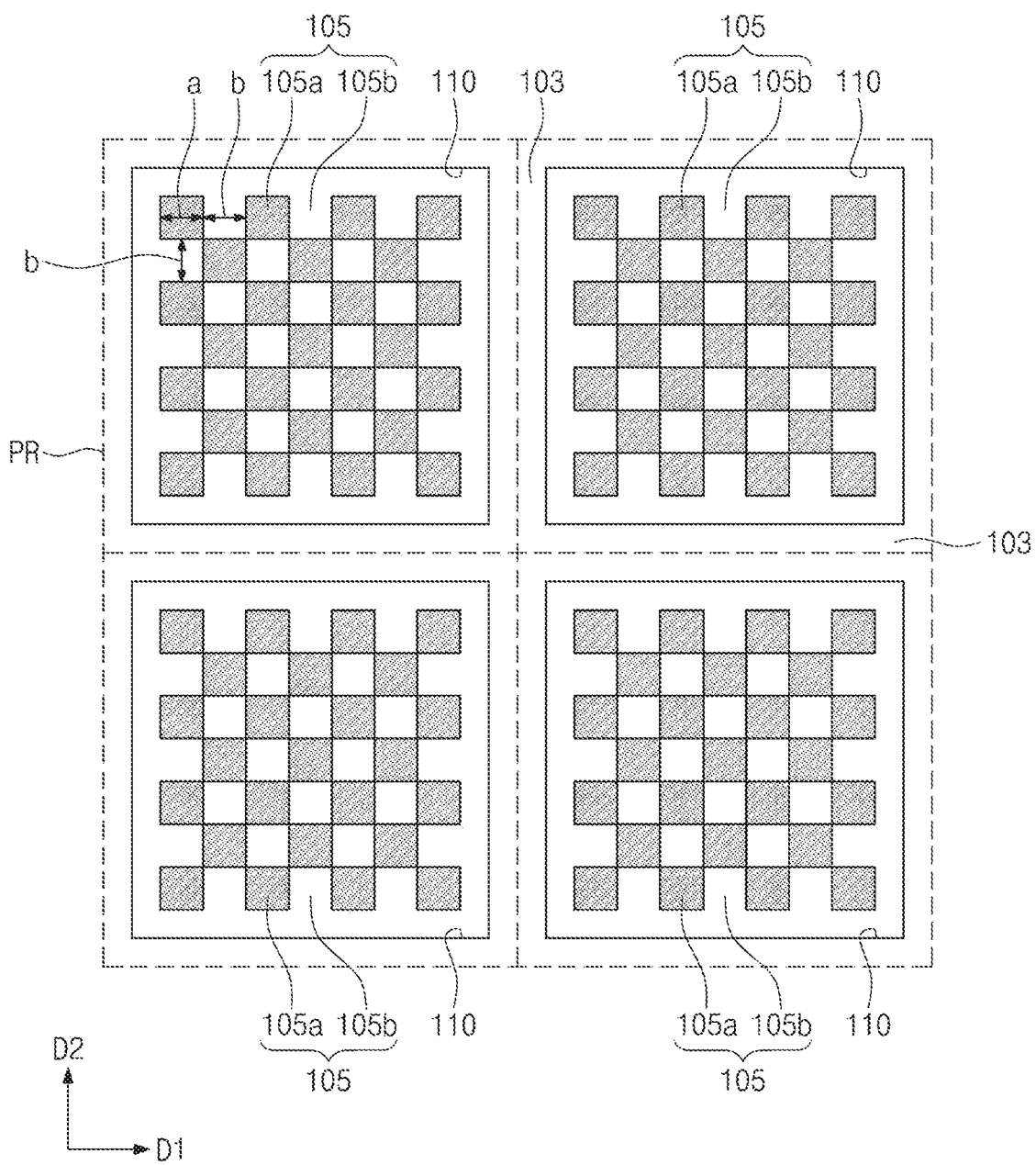
Figure 11C:
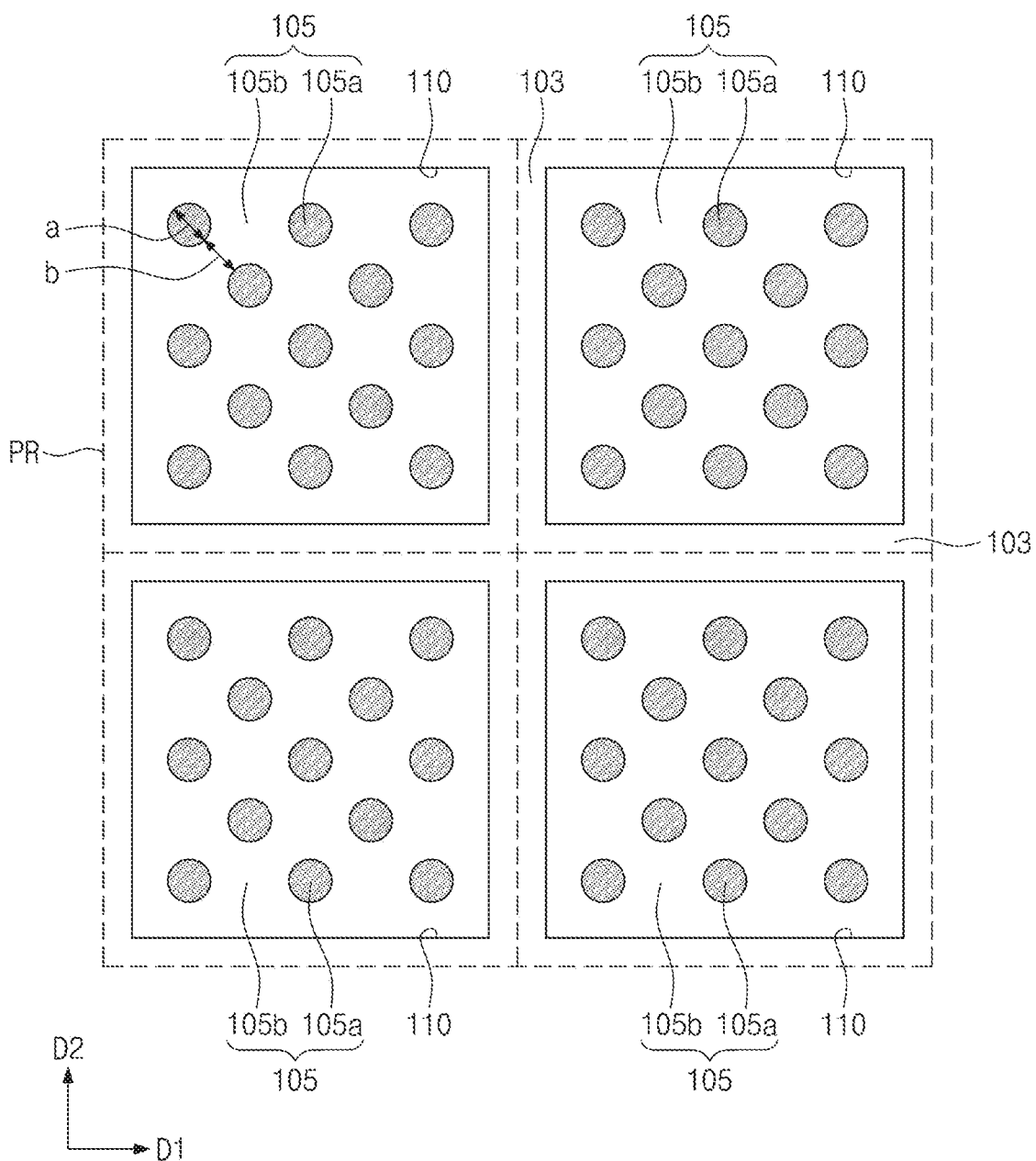

FIGS. 11A, 11B, and 11C are schematic plan views illustrating image sensors according to some embodiments of the inventive concept. Referring to FIGS. 11A and 11B, the grating structure 105 may be provided in each of the pixel regions PR, and the grating structure 105 may include the grating patterns 105*a* and the recess regions 105*b*. The grating patterns 105*a* may have a first width a in both of the first and second directions D1 and D2 and may be spaced apart from each other by the same distance b in both of the first and second directions D1 and D2. In some embodiments, each of the grating patterns 105*a* may have a rectangular, circular, or polygonal shape, when viewed in a plan view. Referring to FIG. 11A, the grating patterns 105*a* may be arranged in the first and second directions D1 and D2 or in a matrix shape. Referring to FIG. 11B, the grating patterns 105*a* may be arranged in a checkerboard shape. Referring to FIG. 11C, the grating patterns 105*a* may be arranged to be spaced apart from each other by the same distance b in a diagonal direction that is inclined to both of the first and second directions D1 and D2. As shown in FIGS. 11A, 11B, and 11C, the grating structure 105 may have substantially the same period, fill factor, and height in the first and second directions D1 and D2.

Figure 12A:
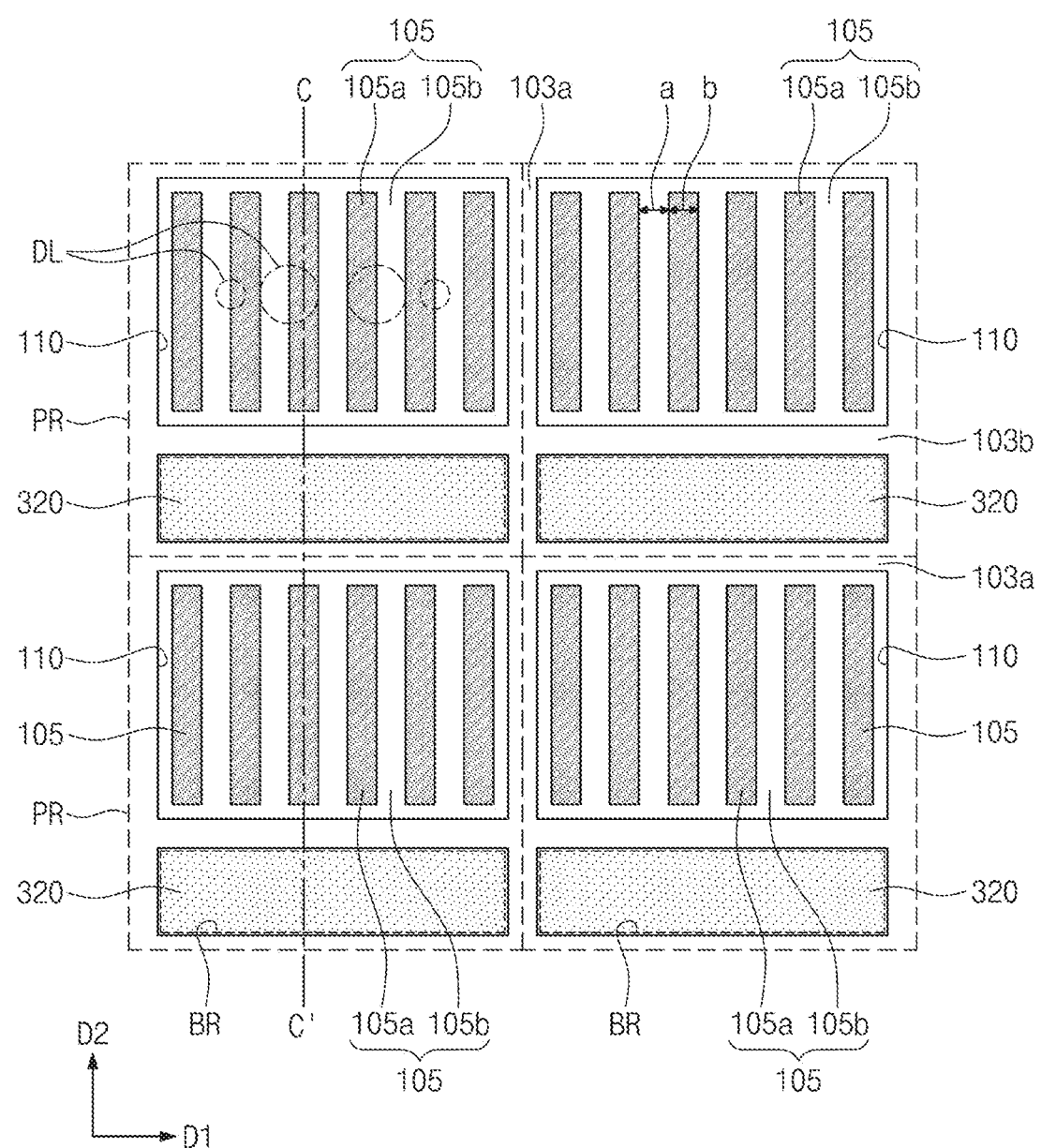
FIGS. 12A and 12B are schematic plan views illustrating an image sensor according to some embodiments of the inventive concept.
Figure 12B:
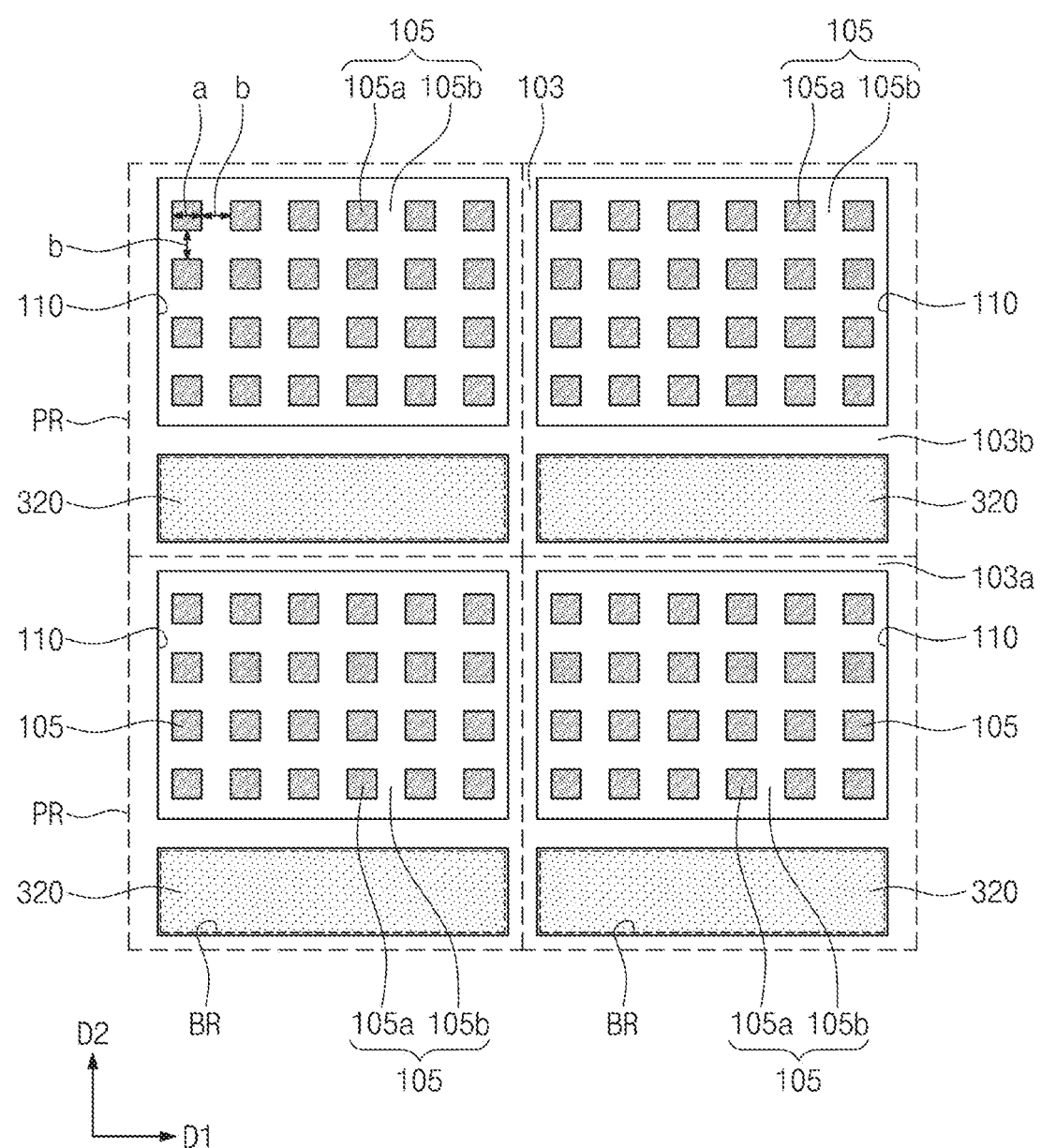
Figure 13:
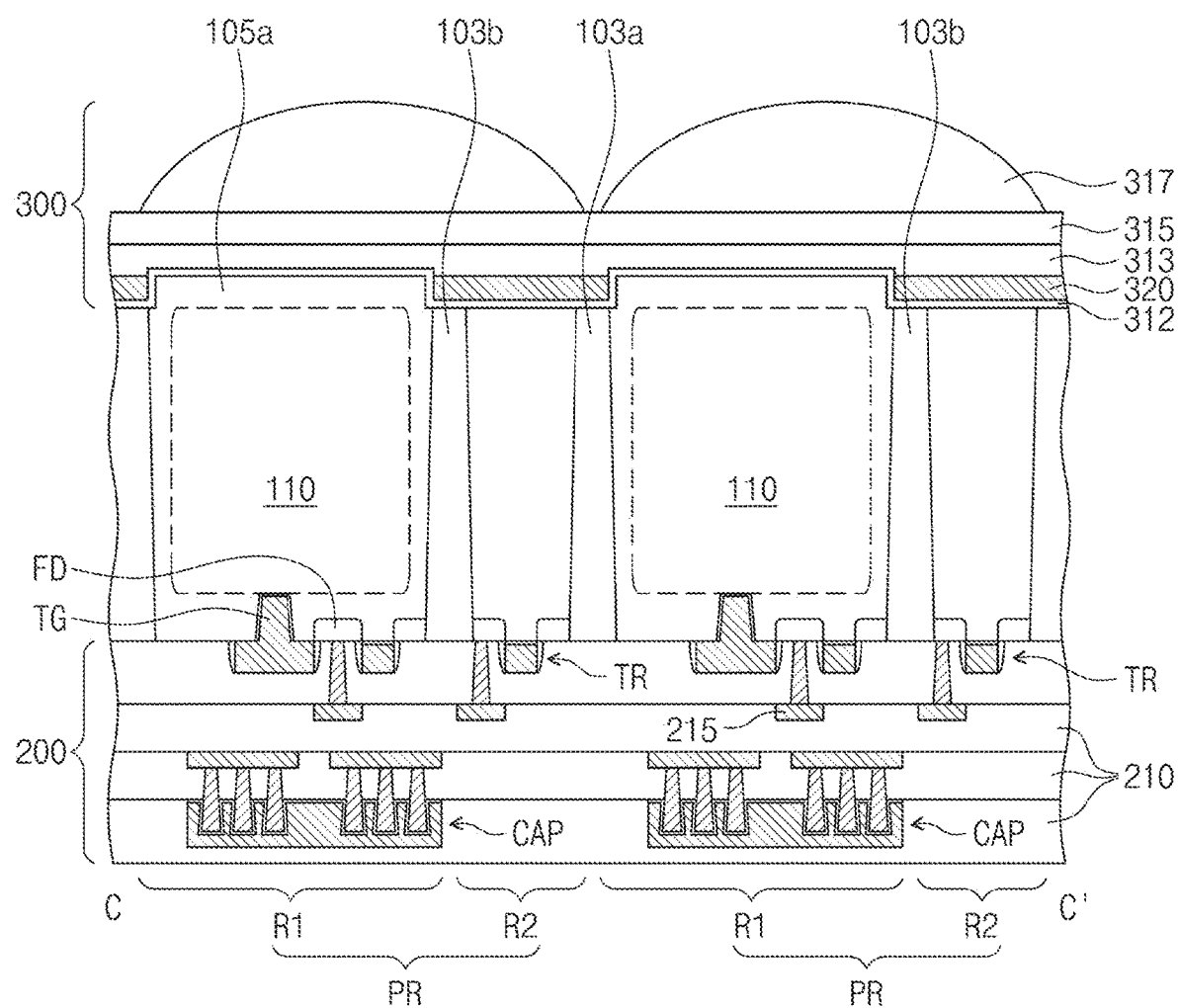
FIG. 13 is a sectional view, which is taken along line C-C' of FIG. 12A and illustrates an image sensor according to some embodiments of the inventive concept.

FIGS. 12A and 12B are schematic plan views illustrating an image sensor according to some embodiments of the inventive concept. FIG. 13 is a sectional view, which is taken along line C-C' of FIG. 12A to illustrate an image sensor according to some embodiments of the inventive concept. Referring to FIGS. 12A and 13, the pixel separation structure 103a may be provided to define a plurality of the pixel regions PR, each of which includes a light-receiving region R1 and a light-blocking region R2 defined by an isolation structure 103b. The isolation structure 103b may cross each pixel region PR in the first or second direction D1 or D2.

When viewed in a vertical section, the pixel separation structure 103a and the isolation structure 103b may be vertically extended from the first surface 100a of the semiconductor substrate 100 to the second surface 100b. A vertical thickness of the isolation structure 103b may be substantially equal to a vertical thickness of the pixel separation structure 103a.

In the light-receiving region R1 of each pixel region PR, the grating structure 105 may be provided on the second surface 100b of the semiconductor substrate 100. The grating structure 105 may include a plurality of the grating patterns 105a, each of which has the first width a, and a plurality of the recess regions 105b between the grating patterns 105a. The grating patterns 105a may be line patterns, which are parallel to each other and are extended in the second direction D2, as previously described with reference to FIGS. 4 and 8. In certain embodiments, as shown in FIG. 12B, the grating structure 105 may include a plurality of the grating patterns 105a arranged in the first and second directions D1 and D2. In addition, the grating structure 105 may be arranged in a checkerboard shape or in a diagonal or oblique direction, as previously described with reference to FIGS. 11B and 11C.

In some embodiments, the grating structure 105 may be designed to provide ±1 or higher order diffraction lights DL to the photoelectric conversion region 110, without a zero order diffraction light. Thus, when viewed in a plan view, the diffraction lights DL produced by the grating structure 105 may propagate a direction perpendicular to the extension direction of the grating patterns 105a (e.g., in the first direction D1). In other words, it may be possible to prevent or suppress the incident light from being incident into the light-blocking region R2 of each pixel region PR.

Furthermore, in the light-blocking region R2, a light-blocking pattern 320 may be provided on the second surface 100b of the semiconductor substrate 100. The light-blocking pattern 320 may be configured to reflect an incident light and to prevent the incident light from being incident into the second surface 100b of the semiconductor substrate 100. In other words, due to the light-blocking pattern 320, the incident light may be prevented from being incident into the light-blocking region R2 of each pixel region PR. The light-blocking pattern 320 may be formed of or include at least one of metallic materials (e.g., tungsten or aluminum). In the case where the grating patterns 105a are formed by patterning the semiconductor substrate 100, a buffer insulating layer 312 may be provided between the light-blocking pattern 320 and the semiconductor substrate 100. Alternatively, in the case where, as described with reference to FIG. 6, the grating structure is formed using a dielectric layer, the light-blocking pattern 320 may be provided in the dielectric layer.

In the light-blocking region R2 of each pixel region PR, signal processing circuits TR may be provided on the first surface 100a of the semiconductor substrate 100. The signal processing circuits TR may include at least one MOS transistor, and they may be configured to perform an operation of holding and sampling electrical signals produced from the light-receiving region R1. Furthermore, the readout circuit layer 200 may include a capacitor CAP, which is used to hold or store electrical signals produced from the light-receiving region R1. The capacitor CAP may include top and bottom electrodes and a dielectric layer therebetween. In this case, the image sensor may be configured such that a global shutter operation may be possible.

Figure 14:
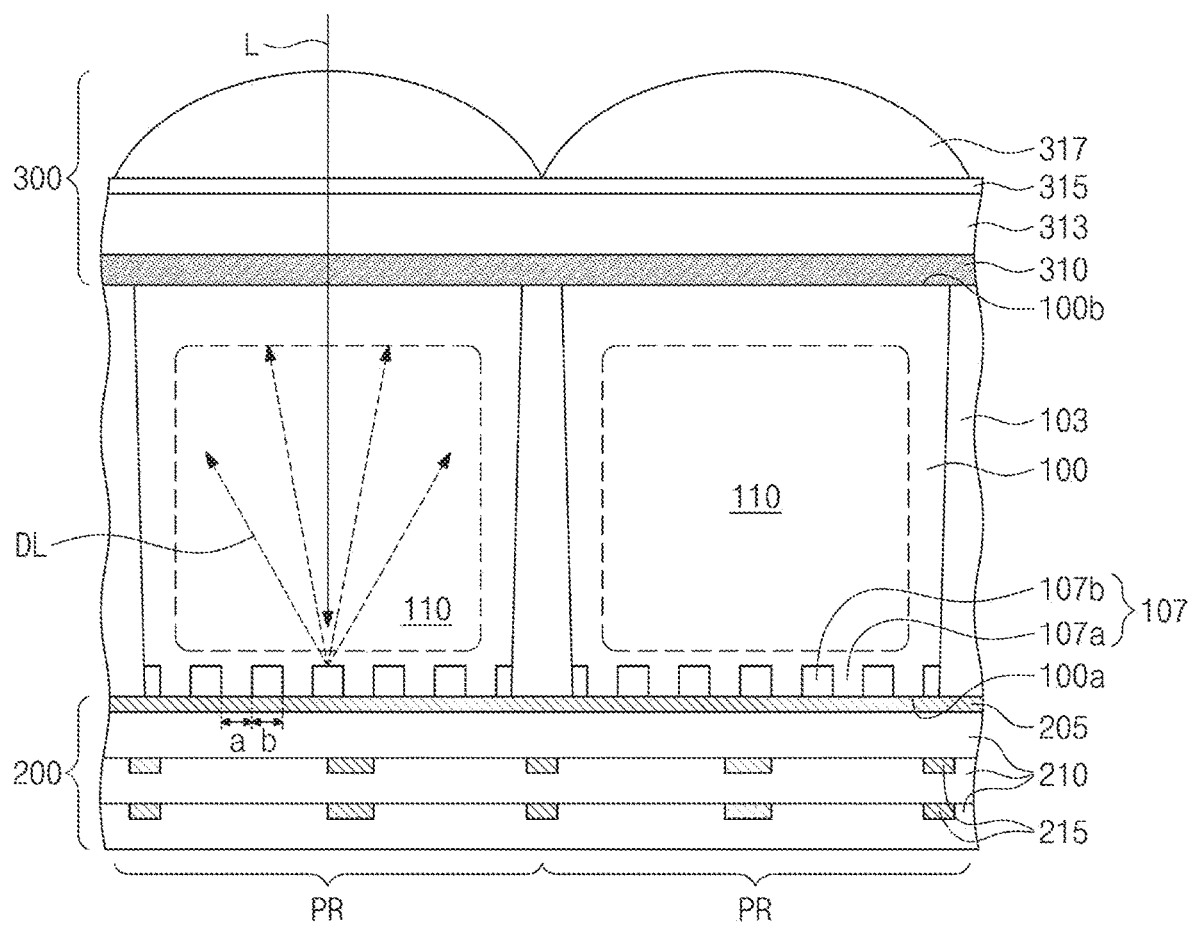
FIGS. 14 and 15 are sectional views illustrating image sensors according to some embodiments of the inventive concept.
Figure 15:
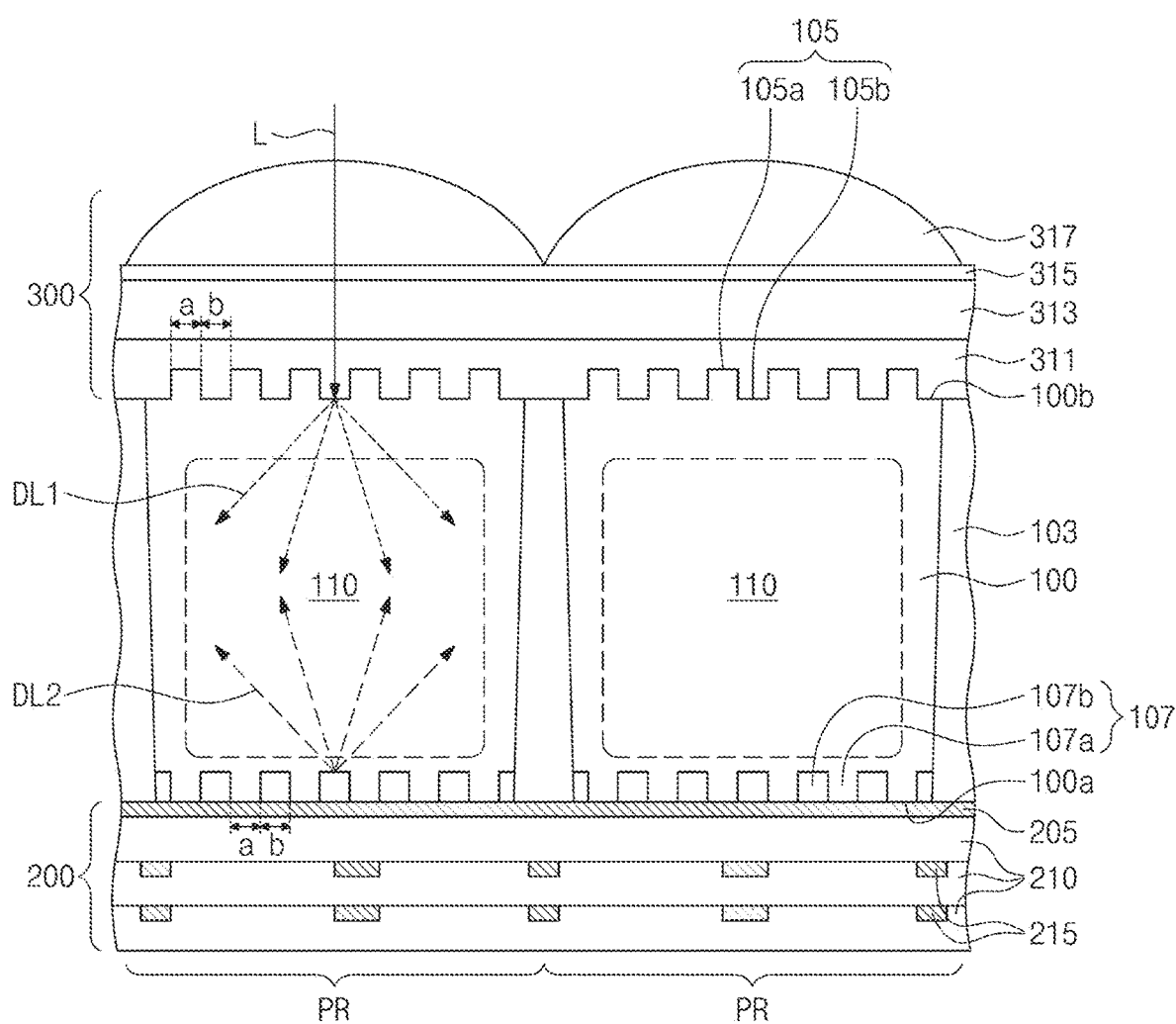

FIGS. 14 and 15 are sectional views illustrating image sensors according to some embodiments of the inventive concept. Referring to FIG. 14, a first grating structure 107 may be provided on the first surface 100a of the semiconductor substrate 100. As previously described with reference to FIGS. 4 to 7, the first grating structure 107 may include a plurality of first grating patterns 107a and a plurality of first recess regions 107b, which are alternately arranged. The first recess regions 107b may be filled with a material having a refractive index lower than that of the semiconductor substrate 100.

A reflection layer 205 may be provided on the first surface 100a of the semiconductor substrate 100, and an anti-reflection layer 310 may be provided on the second surface 100b of the semiconductor substrate 100. The reflection layer 205 may cover the first grating structure 107 and may include at least one of metallic materials (e.g., tungsten (W) or aluminum (Al)). The anti-reflection layer 310 may be formed of or include at least one of silicon oxide, silicon oxynitride, or silicon nitride.

As described above, the first grating structure 107 may be designed to cause diffraction of the incident light L of long wavelength and to suppress a zero order diffraction light. For example, the width a of the grating patterns 105a may be substantially the same as the distance b between the grating patterns 105a. The grating patterns 105a may have a substantially uniform height h. As described above, the first grating structure 107 may include line patterns, which are extended in a specific direction (e.g., in the x, y, or diagonal direction), or concentric circular patterns. In addition, the first grating structure 107 may be spaced apart from each other to form an array-shaped arrangement, as previously described with reference to FIGS. 11A, 11B, and 11C.

In some embodiments, a long wavelength incident light L of about 750 nm or longer may be incident into the semiconductor substrate 100 through the optically-transparent layer 300, and in this case, a penetration depth of the long wavelength incident light may be larger than a thickness of the semiconductor substrate 100. The long wavelength incident light may be reflected by the reflection layer 205 provided on the first surface 100a of the semiconductor substrate 100, and in this case, the reflected light may be diffracted by the first grating structure 107 to form a diffraction light DL entering the photoelectric conversion regions 110 again.

Referring to FIG. 15, the first grating structure 107 may be provided on the first surface 100a of the semiconductor substrate 100, and the second grating structure 105 may be provided on the second surface 100b of the semiconductor substrate 100.

The first grating structure 107 may include a plurality of the first grating patterns 107a and a plurality of the first recess regions 107b, which are alternately arranged. The first recess regions 107b may be filled with a material having a refractive index lower than that of the semiconductor substrate 100.

The second grating structure 105 may include a plurality of the second grating patterns 105a and a plurality of the second recess regions 105b, which are alternately arranged. The second recess regions 105b may be filled with the first planarization insulating layer 311, whose refractive index lower is than that of the semiconductor substrate 100.

The first and second grating structures 105 and 107 may be designed to cause diffraction of the incident light L of long wavelength and to suppress a zero order diffraction light. The first and second grating patterns 105a and 107a may have substantially the same period.

As described above, the first and second grating structures 105 and 107 may include line patterns, which are extended in a specific direction (e.g., in the x, y, or diagonal direction), or concentric circular patterns. In addition, the first and second grating patterns 105a and 107a may be line patterns extended in the same direction. In certain embodiments, the first grating patterns 107a may be provided to cross the second grating patterns 105a. In certain embodiments, the first and second grating structures 105 and 107 may be spaced apart from each other to form an array-shaped arrangement, as described with reference to FIGS. 11A, 11B, and 11C.

According to some embodiments of the inventive concept, the second grating structure 105 may be configured to diffract an incident light, which is incident through the optically-transparent layer 300, and to provide a first diffraction light DL1 produced by the diffraction to the photoelectric conversion region 110. The first grating structure 107 may be configured to diffract light reflected by a reflection layer and to provide a second diffraction light DL2 produced by the diffraction to the photoelectric conversion region 110.

Since, as described above, the first and second diffraction lights DL1 and DL2, which are diffracted by the first and second grating structures 105 and 107 of the semiconductor substrate, are provided to the photoelectric conversion region 110, it may be possible to improve the quantum efficiency of the photoelectric conversion region 110.

According to some embodiments of the inventive concept, an image sensor may include a grating structure causing diffraction of an incident light, and in this case, diffraction lights produced by the grating structure may be incident into photoelectric conversion regions in directions inclined to a surface of a semiconductor substrate. Accordingly, it may be possible to increase a length of propagation path of the incident light and to improve an optical absorption efficiency (e.g., quantum efficiency) in the photoelectric conversion region.

In some embodiments, the grating structure may be configured to allow light to be isotropically incident into the photoelectric conversion regions, and in this case, it may be possible to suppress a cross-talk between pixel regions adjacent to each other.

While example embodiments of the inventive concepts have been particularly shown and described, it will be understood by one of ordinary skill in the art that variations in form and detail may be made therein without departing from the spirit and scope of the attached claims.

What is claimed is:
1. An image sensor comprising:
a semiconductor substrate of first conductivity type having a first semiconductor surface and a second semiconductor surface opposite to the first semiconductor surface;
a pixel separation structure in the semiconductor substrate, the pixel separation structure defining a pixel region;
an isolation structure in the semiconductor substrate, the isolation structure defining a light receiving region and a light blocking region, in the pixel region;
a photoelectric conversion region of second conductivity type in the light receiving region of the semiconductor substrate, said photoelectric conversion region forming a PN rectifying junction with a first portion of the semiconductor substrate;
a transfer gate electrode on the first semiconductor surface of the semiconductor substrate, in the light receiving region;
signal processing circuits on the first semiconductor surface of the semiconductor substrate, in the light blocking region;
a grating structure on the second semiconductor surface of the semiconductor substrate, in the light receiving region, the grating structure comprising grating patterns and recess regions alternately arranged; and
a blocking pattern on the second semiconductor surface of the semiconductor substrate, in the light blocking region;
wherein the semiconductor substrate includes a trench recessed from the second semiconductor surface of the semiconductor substrate in the light blocking region;
wherein a bottom surface of the trench is located at a level lower than top surfaces of the grating patterns;
wherein the grating structure and the blocking pattern are located on a same horizontal plane relative to the first semiconductor surface of the semiconductor substrate; and
wherein the blocking pattern sufficiently fills the trench, and wherein a light receiving surface of the blocking pattern that is farthest from the first semiconductor surface of the semiconductor substrate is coplanar with a light receiving portion of the second semiconductor surface of the semiconductor substrate that is farthest from the first semiconductor surface of the semiconductor substrate.

2. The image sensor of claim 1, wherein each of the recess regions has a second lower width which is the same as a second upper width thereof.

3. The image sensor of claim 1, wherein each of the grating patterns has a first lower width which is the same as a first upper width thereof.

4. The image sensor of claim 1, wherein the pixel separation structure and the isolation structure extend through the semiconductor substrate.

5. The image sensor of claim 1, further comprising:
an interlayer insulation layer on the first semiconductor surface of the semiconductor substrate; and
a capacitor on the interlayer insulation layer in the pixel region, the capacitor including a plurality of bottom electrodes, a top electrode covering the plurality of bottom electrodes, and a dielectric layer between the top electrode and the plurality of bottom electrodes.

6. The image sensor according to claim 1, wherein the light blocking region is provided between the isolation structure and a portion of the pixel separation structure.

7. The image sensor according to claim 1,
wherein the transfer gate electrode has a T-shaped cross-section;
wherein a portion of the transfer gate electrode extends through a corresponding second portion of the semiconductor substrate, which extends between the first semiconductor surface of the semiconductor substrate and the photoelectric conversion region; and
wherein a transfer gate insulating layer extends between: (i) the transfer gate electrode and the second portion of the semiconductor substrate, and (ii) the transfer gate electrode and the photoelectric conversion region.

8. The image sensor of claim 1, further comprising an optically-transparent layer on the second semiconductor surface of the semiconductor substrate.

9. The image sensor according to claim 8, further comprising a microlens on the second semiconductor surface of the semiconductor substrate, wherein the microlens overlaps the light receiving region and the light blocking region; and wherein the optically-transparent layer extends between the microlens and the second semiconductor surface of the semiconductor substrate.

10. An image sensor comprising:
a semiconductor substrate having a first semiconductor surface and a second semiconductor surface opposite to the first surface, and a region of first conductivity type therein;
a pixel separation structure in the semiconductor substrate, the pixel separation structure defining a plurality of pixel regions;
an isolation structure in the semiconductor substrate, the isolation structure defining a light receiving region and a light blocking region, in each of the pixel regions;
photoelectric conversion regions of second conductivity type provided in the light receiving regions of the pixel regions, respectively;
grating patterns provided on the second semiconductor surface of the semiconductor substrate, in the light receiving region, the grating patterns having a same width and a same height;
a blocking pattern on the second semiconductor surface of the semiconductor substrate, in the light blocking region;
a transistor on the first semiconductor surface of the semiconductor substrate, in the light blocking region;
an interlayer insulation layer on the first semiconductor surface of the semiconductor substrate; and
a capacitor on the interlayer insulation layer in each of the pixel regions, the capacitor at least temporarily storing electrical charges produced from each of the photoelectric conversion regions;
wherein the capacitor includes a plurality of bottom electrodes, a top electrode covering the plurality of bottom electrodes, and a dielectric layer between the top electrode and the plurality of bottom electrodes;
wherein the capacitor overlaps each of the photoelectric conversion regions;
wherein the grating pattern and the blocking pattern are located on a same horizontal plane relative to the second semiconductor surface of the semiconductor substrate;
wherein the light receiving region and the light blocking region are located under a same microlens, which extends opposite the corresponding light receiving region and light blocking region; and
wherein a light receiving surface of the blocking pattern that is farthest from the first semiconductor surface of the semiconductor substrate is coplanar with a light receiving portion of the second semiconductor surface of the semiconductor substrate that is farthest from the first semiconductor surface of the semiconductor substrate.

11. The image sensor according to claim 10, wherein the grating patterns include line patterns, which are parallel to each other and are extended in a specific direction.

12. The image sensor according to claim 10, wherein the grating patterns are spaced apart from each other by a same distance in a first direction and a second direction crossing to the first direction.

13. The image sensor according to claim 10, wherein the grating patterns are extended along a first direction, and
wherein each of the grating patterns has a top surface parallel to the second semiconductor surface of the semiconductor substrate and sidewalls perpendicular to the top surface.

14. The image sensor according to claim 10, wherein the pixel separation structure surrounds each of the pixel regions when viewed in a plan view.

15. The image sensor according to claim 10, further comprising an optically-transparent layer, which extends on the second semiconductor surface of the semiconductor substrate and has a refractive index different from that of the semiconductor substrate.

16. The image sensor according to claim 10, further comprising:
a transfer gate electrode on the first semiconductor surface of the semiconductor substrate, in the light receiving region; and
signal processing circuits on the first semiconductor surface of the semiconductor substrate, in the light blocking region,
wherein the blocking pattern vertically overlaps the signal processing circuits.

17. The image sensor according to claim 10, wherein the blocking pattern is between the light receiving regions of adjacent ones of the pixel regions.

18. The image sensor according to claim 10, further comprising:
a transfer transistor including a transfer gate electrode, which extends on the first semiconductor surface of the semiconductor substrate and is separated from the capacitor by a portion of the interlayer insulation layer; and
wherein a portion of the transfer gate electrode extends into a recess in the first semiconductor surface of the semiconductor substrate so that the electrical charges generated at a PN junction between the photoelectric conversion region and the region of first conductivity type within the semiconductor substrate, in response to light incident the light receiving region, can be transferred along a sidewall of the recess when the transfer transistor is activated.

19. An image sensor, comprising:
a semiconductor substrate of first conductivity type having a first semiconductor surface and a second semiconductor surface opposite to the first surface;
a pixel separation structure in the semiconductor substrate, the pixel separation structure defining a pixel region;
an isolation structure in the semiconductor substrate, the isolation structure defining a light receiving region and a light blocking region, in the pixel region;
a photoelectric conversion layer of second conductivity type provided in the light receiving region of the semiconductor substrate, said photoelectric conversion layer forming a PN rectifying junction with a first portion of the semiconductor substrate;
a transfer gate electrode on the first semiconductor surface of the semiconductor substrate, in the light receiving region;
a transistor on the first semiconductor surface of the semiconductor substrate, in the light blocking region;
a grating structure on the second semiconductor surface of the semiconductor substrate, in the light receiving region, the grating structure comprising grating patterns and recess regions alternately arranged;
a blocking pattern in the recess regions and in the light blocking region, the blocking pattern having a bottom surface located at a level lower than top surfaces of the grating pattern; and
a buffer insulating layer continuously extending from a region between the bottom surface of the blocking pattern in the recess regions and the second semiconductor surface of the semiconductor substrate onto the top surfaces of the grating patterns; and
wherein a light receiving surface of the blocking pattern that is farthest from the first semiconductor surface of the semiconductor substrate is coplanar with a light receiving portion of the second semiconductor surface of the semiconductor substrate that is farthest from the first semiconductor surface of the semiconductor substrate.

20. The image sensor according to claim 19,
wherein the transfer gate electrode has a T-shaped cross-section;
wherein a portion of the transfer gate electrode extends through a corresponding second portion of the semiconductor substrate, which extends between the first semiconductor surface of the semiconductor substrate and the photoelectric conversion layer; and
wherein a transfer gate insulating layer extends between: (i) the transfer gate electrode and the second portion of the semiconductor substrate, and (ii) the transfer gate electrode and the photoelectric conversion layer.

* * * * *